US012765407B2

(12) United States Patent
Ahn

(10) Patent No.: US 12,765,407 B2
(45) Date of Patent: Oct. 13, 2026

(54) SEMICONDUCTOR PACKAGE

(71) Applicant: SAMSUNG ELECTRONICS CO., LTD., Suwon-si (KR)

(72) Inventor: Seok Geun Ahn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 451 days.

(21) Appl. No.: 18/368,646

(22) Filed: Sep. 15, 2023

(65) Prior Publication Data

US 2024/0128176 A1 Apr. 18, 2024

(30) Foreign Application Priority Data

Oct. 12, 2022 (KR) ........................ 10-2022-0130895

(51) Int. Cl.
*H10W 70/685* (2026.01)
*H10W 70/60* (2026.01)
(Continued)

(52) U.S. Cl.
CPC ......... *H10W 70/685* (2026.01); *H10W 70/65* (2026.01); *H10W 90/00* (2026.01);
(Continued)

(58) Field of Classification Search
CPC ......... H01L 23/49822; H01L 23/49816; H01L 23/49838; H01L 24/08; H01L 25/0657; H01L 25/105; H01L 25/0652; H01L 25/50; H01L 2225/06541; H01L 2225/06548; H10W 90/701; H10W 90/00;
(Continued)

(56) References Cited

U.S. PATENT DOCUMENTS

| | | | |
|---|---|---|---|
| 7,838,975 | B2 | 11/2010 | Chen |
| 8,143,710 | B2 | 3/2012 | Cho |

(Continued)

FOREIGN PATENT DOCUMENTS

| | | |
|---|---|---|
| KR | 2020-0035600 A | 4/2020 |
| KR | 2020-0047845 A | 5/2020 |

(Continued)

*Primary Examiner* — Mohsen Ahmadi
(74) *Attorney, Agent, or Firm* — Fish & Richardson P.C.

(57) ABSTRACT

A semiconductor package includes; a semiconductor substrate including a device region and an edge region, a first redistribution layer on a lower surface of the semiconductor substrate, a second redistribution layer on an upper surface of the semiconductor substrate, through vias vertically penetrating the semiconductor substrate in the edge region to electrically connect the first redistribution layer and the second redistribution layer, and a circuit layer between the lower surface of the semiconductor substrate and the first redistribution layer. The circuit layer may include; a circuit element on the lower surface of the semiconductor substrate, a circuit wiring pattern electrically connected to the circuit element and the first redistribution layer, and a device interlayer dielectric layer substantially encompassing the circuit element and the circuit wiring pattern, wherein the circuit element and the circuit wiring pattern are disposed in the device region and not in the edge region.

20 Claims, 26 Drawing Sheets

(51) Int. Cl.
*H10W 70/65* (2026.01)
*H10W 70/656* (2026.01)
*H10W 90/00* (2026.01)

(52) U.S. Cl.
CPC .......... *H10W 70/60* (2026.01); *H10W 70/656* (2026.01); *H10W 90/722* (2026.01); *H10W 90/794* (2026.01)

(58) Field of Classification Search
CPC ... H10W 72/90; H10W 80/00; H10W 70/685; H10W 70/65; H10W 70/60
See application file for complete search history.

(56) References Cited

U.S. PATENT DOCUMENTS

| | | | | |
|---|---|---|---|---|
| 8,884,416 | B2 * | 11/2014 | Lee | H01L 25/0657 257/276 |
| 9,000,584 | B2 | 4/2015 | Lin et al. | |
| 9,659,806 | B2 * | 5/2017 | Chang | H01L 23/5384 |
| 9,818,653 | B2 | 11/2017 | Graf et al. | |
| 9,905,549 | B1 | 2/2018 | Lin et al. | |
| 10,535,632 | B2 * | 1/2020 | Jeng | H01L 24/19 |
| 11,251,155 | B2 | 2/2022 | Lee et al. | |
| 2009/0305502 | A1 * | 12/2009 | Lee | H01L 23/5226 257/E21.597 |
| 2015/0145055 | A1 * | 5/2015 | Kim | H01L 21/768 438/618 |
| 2017/0084589 | A1 * | 3/2017 | Kuo | H10W 70/614 |
| 2020/0135684 | A1 * | 4/2020 | Kim | H01L 24/09 |
| 2020/0168550 | A1 * | 5/2020 | Ryu | H01L 24/19 |
| 2020/0273806 | A1 * | 8/2020 | Chiang | B23K 26/0006 |
| 2021/0272930 | A1 * | 9/2021 | Choi | H01L 25/50 |
| 2021/0343547 | A1 * | 11/2021 | Chang | H01L 21/6835 |
| 2021/0383885 | A1 | 12/2021 | Chien | |
| 2021/0407962 | A1 * | 12/2021 | Kim | H01L 23/5381 |
| 2022/0199520 | A1 * | 6/2022 | Kang | H10W 20/496 |
| 2022/0367369 | A1 * | 11/2022 | Fang | H01L 25/0657 |
| 2022/0392843 | A1 * | 12/2022 | Kim | H10W 70/09 |
| 2023/0065366 | A1 * | 3/2023 | Kim | H10W 72/00 |
| 2023/0369263 | A1 * | 11/2023 | Chuang | H01L 24/20 |

FOREIGN PATENT DOCUMENTS

| | | | |
|---|---|---|---|
| KR | 2020-0061228 | A | 6/2020 |
| TW | 200425457 | A | 11/2004 |
| TW | 200539415 | A | 12/2005 |
| TW | 201611214 | A | 3/2016 |
| TW | 202023329 | A | 6/2020 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2022-0130895 filed on Oct. 12, 2022 in the Korean Intellectual Property Office, the subject matter of which is hereby incorporated by reference in its entirety.

BACKGROUND

The inventive concept relates generally to semiconductor packages and methods of fabricating same.

Semiconductor chips have gradually become more compact with the continuous development of various semiconductor technologies. However, more functions have been integrated into contemporary and emerging semiconductor chips. Accordingly, semiconductor chips must provide a large number of input/output (I/O) pads on a relatively small area.

A variety of semiconductor packages provide practical accessibility to, and functional utilization of corresponding semiconductor chip(s). In a typical semiconductor package, one or more semiconductor chip(s) is mounted (e.g., electrically connected and/or mechanically assembled) on a substrate (e.g., printed circuit board) using bonding wires and/or conductive bumps. Various studies have been conducted to improve the structural stability and electrical utility of semiconductor packages.

Unfortunately, as the size of contemporary and emerging semiconductor chips continues to decrease, it is difficult to adhere, handle, and test constituent solder balls. Additionally, problems have arisen in the acquisition of diversified mount board(s) in accordance with the size of corresponding semiconductor chip(s).

SUMMARY

Embodiments of the inventive concept provide compact semiconductor packages exhibiting improved thermal radiation properties, increased integration and improved electrical properties.

According to some embodiments of the present inventive concepts, a semiconductor package may comprise: a first semiconductor substrate that has a device region and an edge region; a first semiconductor element on the device region, wherein the first semiconductor element is formed on an active surface of the first semiconductor substrate; a first circuit layer disposed on the active surface of the first semiconductor substrate; a first redistribution layer disposed on the first circuit layer; and a plurality of first through vias on the edge region, wherein the first through vias vertically penetrate the first semiconductor substrate and the first circuit layer and are connected to the first redistribution layer. The first circuit layer may include: a first device interlayer dielectric layer that covers the active surface of the first semiconductor substrate; and a first circuit wiring pattern on the device region, wherein the first circuit wiring pattern is provided in the first device interlayer dielectric layer and connected to the first semiconductor element. The first circuit wiring pattern and the first through vias may be electrically connected through the first redistribution layer. The first through vias may be arranged in at least two columns that extend along a lateral surface of the first semiconductor substrate and that are spaced apart from each other in a direction from the device region toward the lateral surface of the first semiconductor substrate.

According to some embodiments of the present inventive concepts, a semiconductor package may comprise: a first semiconductor chip that includes a first silicon substrate, a first semiconductor element formed on an active surface of the first silicon substrate, and a first circuit layer disposed on the active surface of the first silicon substrate; a first redistribution layer disposed on an active surface of the first semiconductor chip and coupled to the first circuit layer; a second redistribution layer disposed on an inactive surface of the first semiconductor chip; a first through via that vertically penetrates the first semiconductor chip and connects the first redistribution layer and the second redistribution layer to each other; and a plurality of pads disposed on the first redistribution layer. The first circuit layer may include: a first device interlayer dielectric layer that covers the active surface of the first silicon substrate; and a first circuit wiring pattern provided in the first device interlayer dielectric layer. The first through via may be spaced apart from the first circuit wiring pattern.

According to some embodiments of the present inventive concepts, a semiconductor package may comprise: a package substrate; and a chip package mounted on the package substrate. The chip package may include: a semiconductor chip that includes a silicon substrate and a circuit wiring pattern on the silicon substrate, the silicon substrate having a semiconductor element formed on an active surface of the silicon substrate, and the circuit wiring pattern being connected to the semiconductor element; a first redistribution layer disposed on a first surface of the semiconductor chip, the first surface being directed toward the package substrate; a second redistribution layer disposed on a second surface of the semiconductor chip, the second surface being opposite to the first surface; and a plurality of through vias that vertically penetrate the semiconductor chip and connect the first redistribution layer and the second redistribution layer to each other. The through vias may be positioned between the circuit wiring pattern and an outer lateral surface of the silicon substrate. A distance from the outer lateral surface of the silicon substrate to a conductive pattern of the first redistribution layer may be less than a distance from the outer lateral surface of the silicon substrate to the circuit wiring pattern.

BRIEF DESCRIPTION OF THE DRAWINGS

Advantages, benefits and features, as well as the making and use of the inventive concept may be clearly understood upon consideration of the following detailed description together with the accompanying drawings, in which.

DETAILED DESCRIPTION

Throughout the written description and drawings, like reference numbers and labels are used to denote like or similar elements, components, features, and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Certain embodiments of the inventive concept or related aspects thereof, may be described in relation to an assumed geometric orientation described by a first direction D1 (e.g., a first horizontal direction), a second direction D2 (e.g., a second horizontal direction) intersecting the first direction D1, and a third direction D3 (e.g., a vertical direction) substantially orthogonal to the first and second directions D1 and D2.

Figure 1:
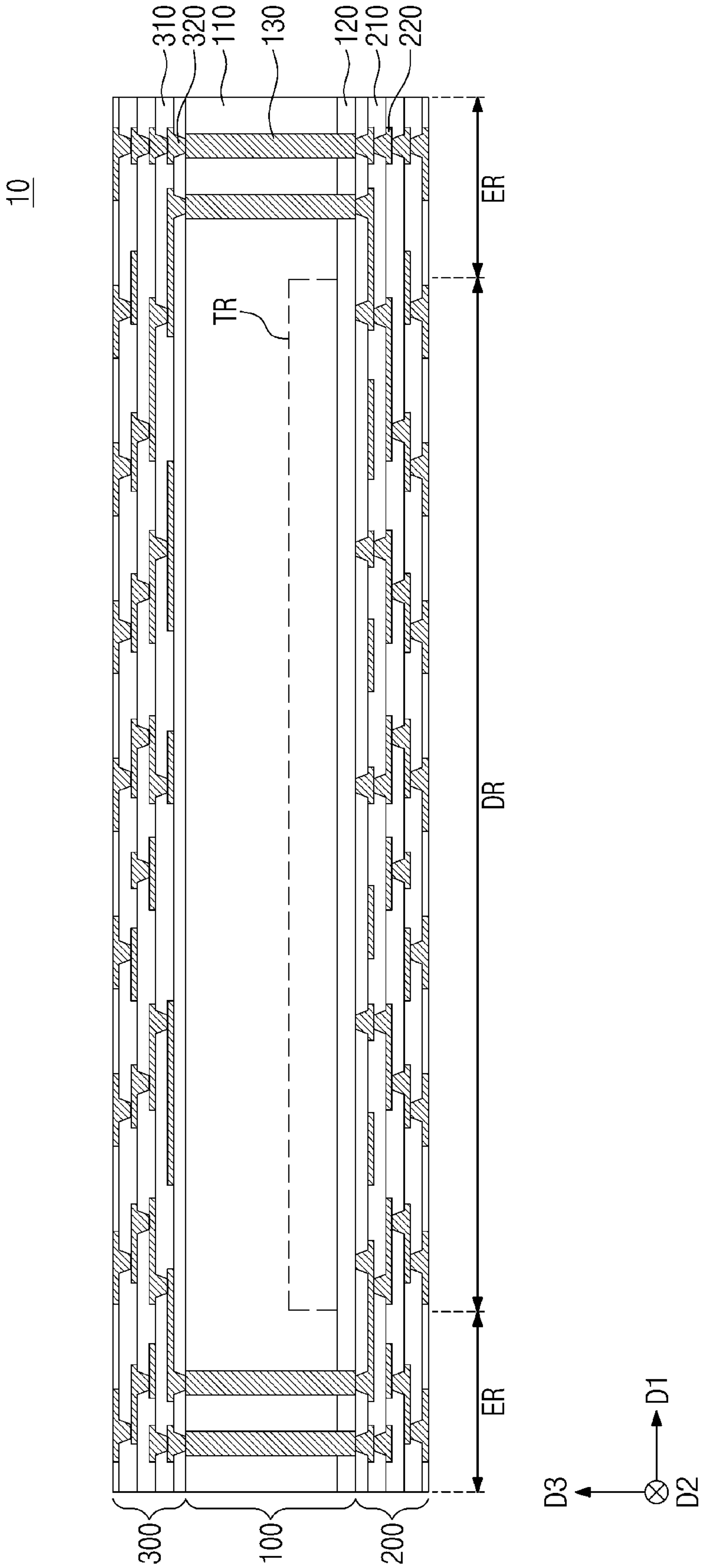
FIG. 1 is a cross-sectional view illustrating a semiconductor package 10 according to embodiments of the inventive concept.
Figure 2:
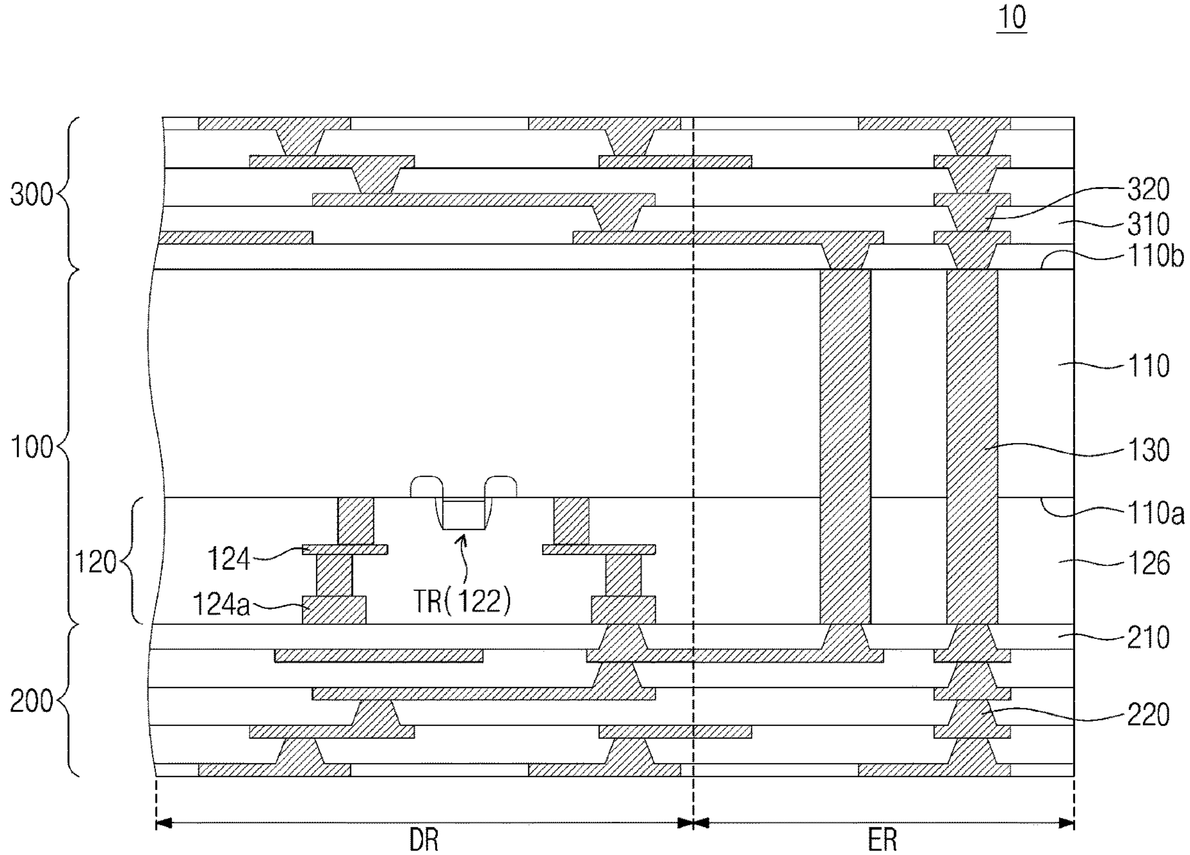
FIG. 2 is an enlarged cross-sectional view further illustrating, in part, the semiconductor package 10 of FIG. 1.
Figure 3:
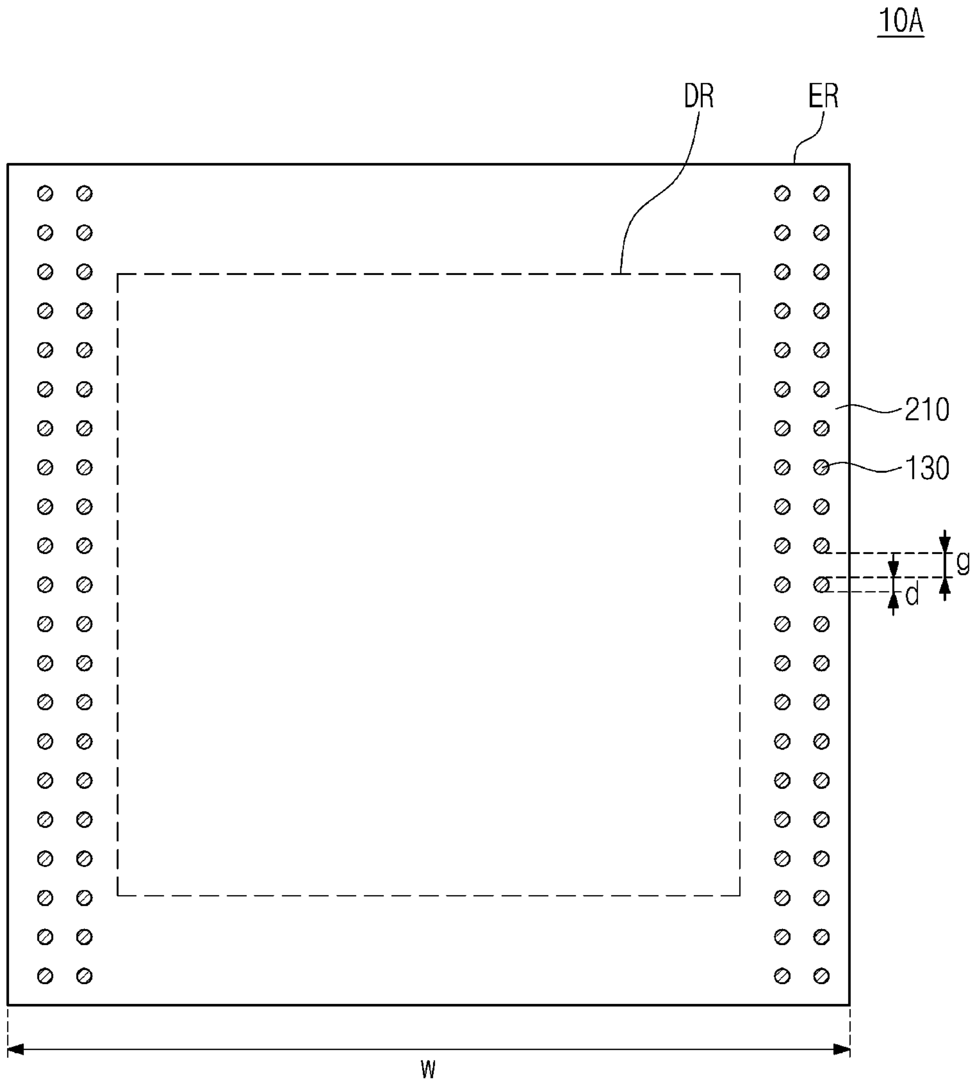
FIGS. 3, 4 and 5 are respective plan (or top-down) views illustrating a semiconductor packages 10A, 10B and 10C according to embodiments of the inventive concept.
Figure 4:
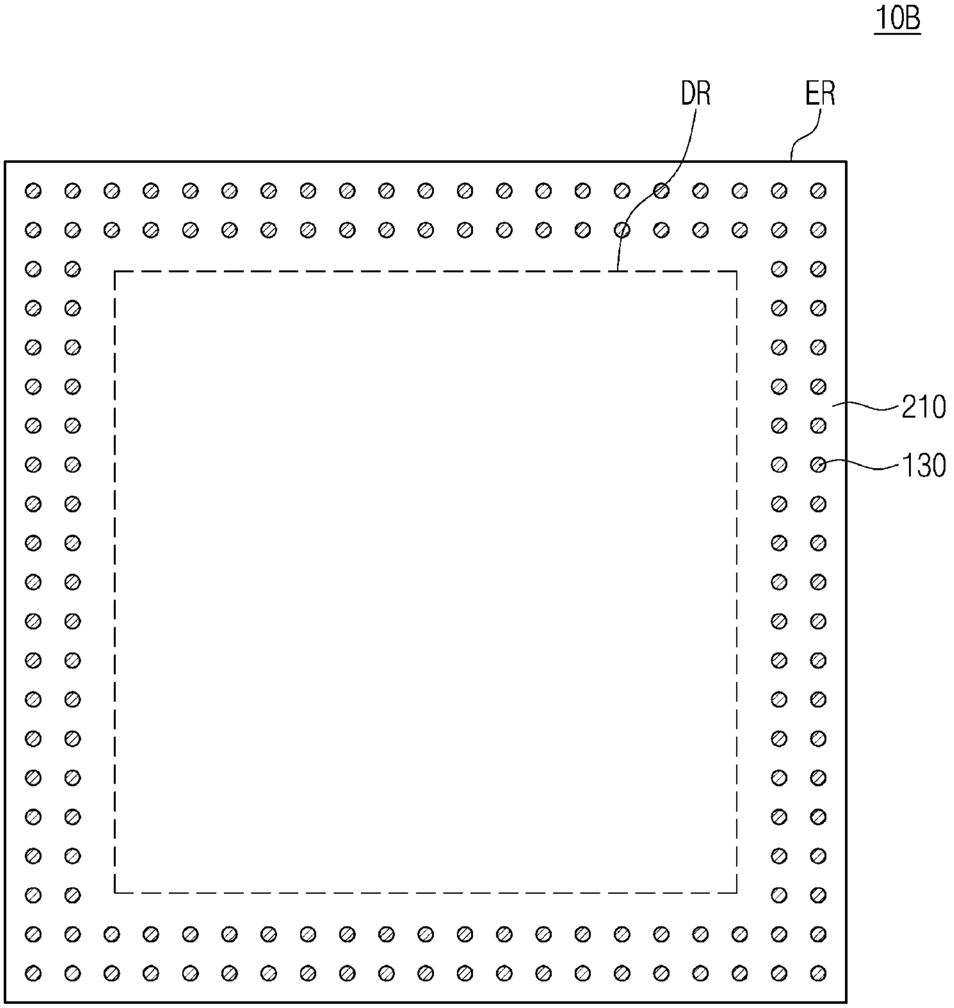
Figure 5:
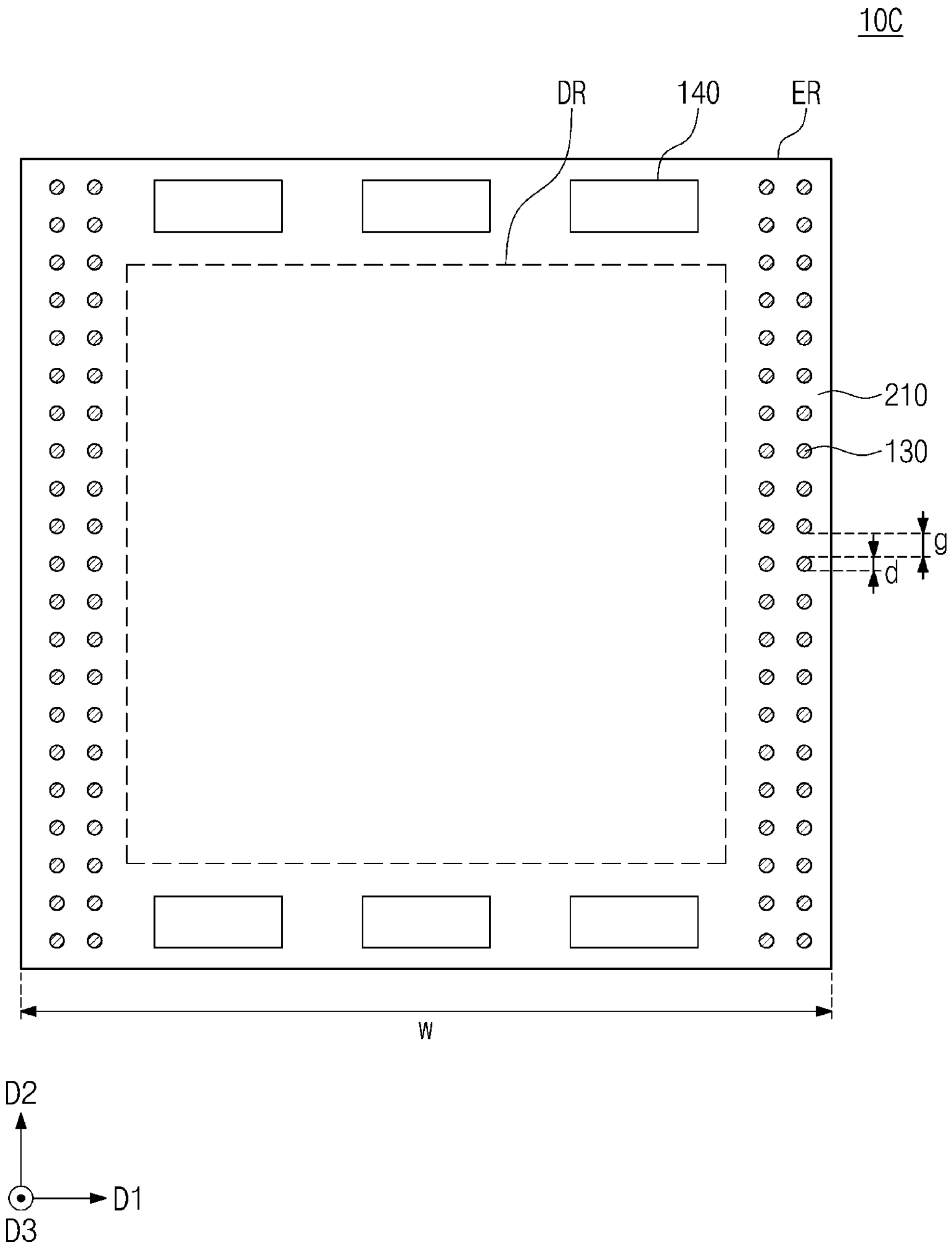
Figure 6:
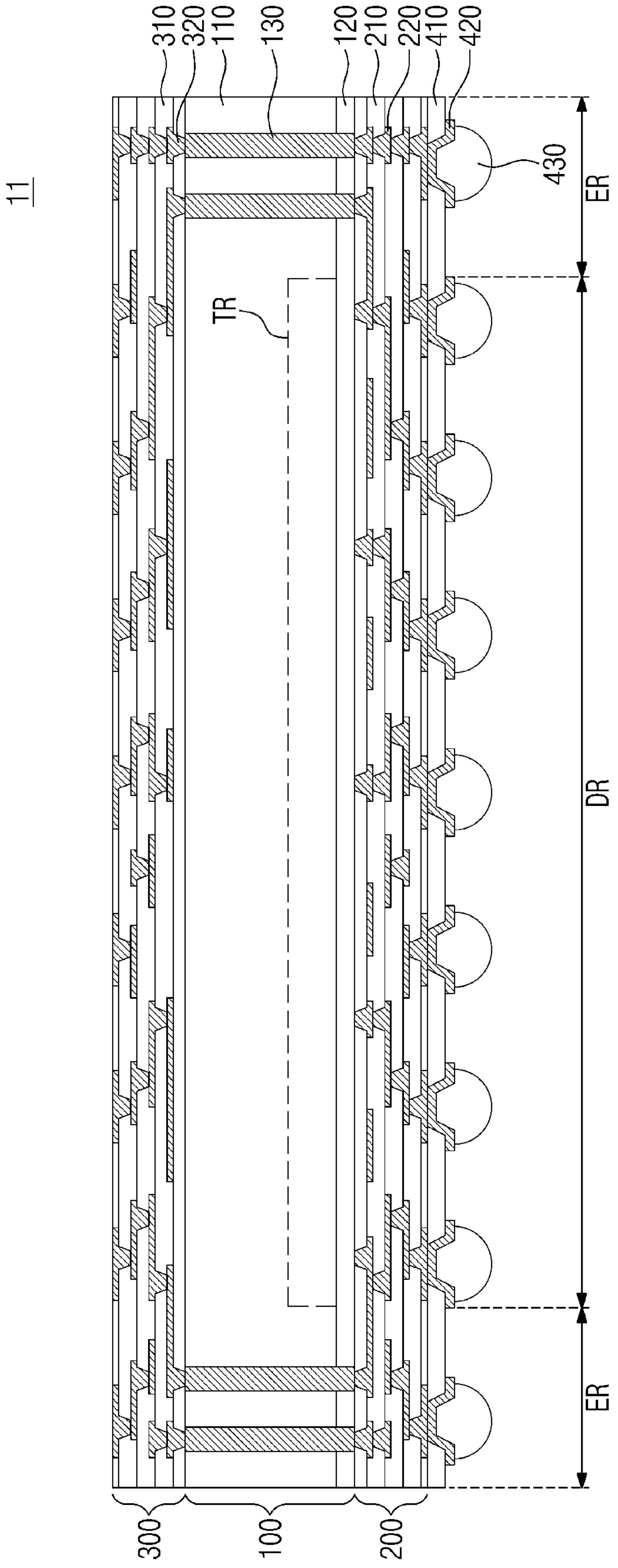
FIGS. 6 and 7 are respective cross-sectional views illustrating semiconductor packages 11 and 12 according to embodiments of the inventive concept.

Figure (FIG. 1 is a cross-sectional view illustrating a semiconductor package 10 according to embodiments of the inventive concept; FIG. 2 is an enlarged cross-sectional view further illustrating, in part, the semiconductor package 10 of FIG. 1; FIGS. 3, 4 and 5 are respective plan views illustrating semiconductor packages 10A, 10B, and 10C according to embodiments of the inventive concept; and FIG. 6 is a cross-sectional view illustrating a semiconductor package 11 according to embodiments of the inventive concept.

Referring to FIGS. 1 and 2, the semiconductor package 10 may include a semiconductor chip 100, wherein the semiconductor chip 100 includes a semiconductor substrate 110 and a circuit layer 120.

In some embodiments, the semiconductor substrate 110 may have a width 'w' (e.g., a dimension measured in the first horizontal direction D1) that ranges from between about 3 mm to about 50 mm (See, e.g., FIG. 5). Thus, assuming the semiconductor substrate 110 has a square shape, its area may range from between about 9 $mm^2$ to about 2,500 $mm^2$. The semiconductor substrate 110 may include at least one semiconductor material, such as for example, a monocrystalline silicon (Si).

The semiconductor substrate 110 may be conceptually and/or functionally divided into a device region DR and an edge region ER. Referring to FIGS. 3, 4 and 5, the device region DR may be centrally disposed, whereas the edge region ER may be peripherally disposed, at least in part, around the device region DR. That is, a variously configured edge region ER may substantially surround (or encompass) the centrally-disposed edge region DR. (Compare, e.g., FIGS. 3, 4 and 5). With such configurations, the edge region ER may be horizontally disposed (e.g., in the first horizontal direction D1 and the second horizontal direction D2) between the device region DR and respective outer edges of the semiconductor substrate 110.

The device region DR may be a region in which one or more semiconductor elements (e.g., the semiconductor chip 100) may be disposed on the semiconductor substrate 110. In contrast, the edge region ER may be understood as a region in which semiconductor element(s) is/are not disposed. In various embodiments, a ratio between a first area occupied by (or designated for) the device region DR and a second area occupied by (or designated for) the edge region ER may range from between about 5:95 to about 95:5.

Referring to FIG. 2, the semiconductor substrate 110 may include a first (or lower) surface 110*a* and an opposing second (or upper) surface 110*b*. In some embodiments, the first surface 110*a* of the semiconductor substrate 110 may be a front surface and the second surface 110*b* of the semiconductor substrate 110 may be a rear surface. Here, the term "front surface" denotes a surface generally including various wirings, interconnection lines, pads, passive elements and/or active elements. Further in this regard, one or more of the first surface 110*a* and the second surface 110*b* may be either an active surface or an inactive surface.

As illustrated in FIG. 2, for example, the semiconductor chip 100 may include the circuit layer 120 on its first surface 110*a*, wherein the circuit layer 120 may variously include circuit element 122 and circuit wiring pattern 124. Here, the circuit element 122 of FIG. 2 may include a variety of active and/or passive element(s), such as one or more transistor(s) of varying type, resistor(s), capacitor(s), etc. The circuit wiring pattern 124 may include one or more wiring(s), interconnection(s), pad(s), via(s), etc., that may be used to variously interconnect the constituent parts of the circuit element 122.

With respect to the circuit element 122, one or more transistors TR may each include a source and a drain on a lower portion of the semiconductor substrate 110, a gate electrode on the first surface 110*a* of the semiconductor substrate 110, and a gate dielectric layer interposed between the semiconductor substrate 110 and the gate electrode.

In some embodiments, the circuit element 122 may include multiple transistors TR and/or one or more logic circuit(s). As disposed in the device region DR on the first surface 110*a*, the circuit element 122 may include a shallow device isolation pattern, logic cell(s) and/or memory cell(s). The circuit element 122 will not usually be disposed on the edge region ER of the semiconductor substrate 110.

The first surface 110*a* of the semiconductor substrate 110 may be substantially covered by a device interlayer dielectric layer 126. On the device region DR, the device interlayer dielectric layer 126 may substantially encompass the circuit element 122 and an associated circuit writing pattern 124. In some embodiments, the device interlayer dielectric layer 126 may fully encompass the circuit element 122 and may substantially encompass the circuit wiring element 124, save for selectively exposed portions (e.g., selected lower surfaces of the circuit wiring element 124 exposed through a lower surface of the device interlayer dielectric layer 126).

In some embodiments, the device interlayer dielectric layer 126 may extend under the semiconductor substrate 110, and may include at least one of silicon oxide (SiO), silicon nitride (SiN), and silicon oxynitride (SiON). Alternately or additionally, the device interlayer dielectric layer 126 may include a low-k dielectric material.

The device interlayer dielectric layer 126 may have a mono-layered structure or a multi-layered structure. For example, the device interlayer dielectric layer 126 may be a multi-layered structure substantially encompassing multiple wiring layers, wherein an etch stop layer may be interposed between adjacent dielectric layers associated with the device interlayer dielectric layer 126. For example, the etch stop layer may be provided on a lower surface of each dielectric layer, and may include at least one of silicon nitride (SiN), silicon oxynitride (SiON), and silicon carbonitride (SiCN).

As noted above, the device interlayer dielectric layer 126 may substantially encompass the circuit wiring pattern 124. The circuit wiring pattern 124 does not extend into the edge region ER. Accordingly, the circuit layer 120 may only include the device interlayer dielectric layer 126 in the device region DR, such that circuit layer 120 may include the device interlayer dielectric layer 126, the circuit element 122 and the circuit wiring pattern 124. As illustrated in FIG. 2, the circuit wiring pattern 124 may variously include wiring patterns, such as horizontally extending connection(s) and/or vertically-extending connection(s).

One or more portions (e.g., portion 124*a* in FIG. 2) of the circuit wiring pattern 124 may be selectively exposed through the device interlayer dielectric layer 126. For example, the exposed wiring portion 124*a* may be a lower portion of the circuit wiring pattern 124 exposed through the device interlayer dielectric layer 126. Thus, in some embodiments, the exposed wiring portion 124*a* may have a lower surface that is coplanar with that of the device interlayer dielectric layer 126. The circuit wiring pattern 124 may be variously configured between upper and lower surfaces of the device interlayer dielectric layer 126.

As illustrated in FIG. 2, the semiconductor substrate 110 may include variously configured circuit wiring patterns 124, wherein the circuit wiring pattern 124 may include at least of, for example, copper (Cu) and tungsten (W).

Connection contacts provided by the circuit wiring pattern 124 may be used to connect the circuit element 122 and/or the semiconductor substrate 110. For example, various connection contacts may vertically penetrate the device interlayer dielectric layer 126 to connect one or more source electrodes, drain electrodes, and gate electrodes of the transistors TR or to various components associated with the circuit element 122. Such connection contacts may include, for example, tungsten (W).

Accordingly, the circuit layer 120 may include the circuit element 122 (as variously constituted), the device interlayer dielectric layer 126, and the circuit wiring pattern 124.

The semiconductor chip 100 may further include one or more through vias 130 provided on the edge region ER. The through vias 130 may be respective conductive patterns forming vertical connection paths. The through vias 130 may vertically penetrate the semiconductor substrate 110 and the device interlayer dielectric layer 126. The through vias 130 may be exposed on the lower surface of the device interlayer dielectric layer 126 and/or an upper surface of the semiconductor substrate 110. The through vias 130 may be provided on the edge region ER of the semiconductor substrate 110, but not on the device region DR. Each one of the through vias 130 may have an elliptical cross-sectional shape and having a diameter ranging from between about 0.001 mm to about 1 mm (See, e.g., FIG. 3). Each of the through vias 130 may have an aspect ratio ranging from between about 0.5 to about 10. The through vias 130 may include at least one of, for example, copper (Cu), aluminum (Al), gold (Au), silver (Ag), tin (Sn), carbon (C), cobalt (Co), manganese (Mn), and lead (Pb).

Since the through vias 130 are disposed on the edge region ER, they are horizontally spaced apart (e.g., in the first horizontal direction D1 or the second horizontal direction D2) from the device region DR. Hence, the through vias 130 are horizontally spaced apart from the circuit wiring pattern 124, such that the through vias 130 are not directly connected to the circuit wiring pattern 124. Further, with this configuration, the through vias 130 are closer to an outer edge of the semiconductor substrate 110 than the circuit wiring pattern 124. Accordingly, a distance from the outer edge of the semiconductor substrate 110 to the through vias 130 is less than a distance from the outer edge of the semiconductor substrate 110 to the circuit wiring pattern 124.

In some embodiments, the through vias 130 may be disposed in an arrangement including at least two columns extending along at least one side of the edge region ER. For example, as shown in FIG. 3, the through vias 130 may be disposed on two opposing sides of the edge region. Alternately, as shown in FIG. 4, the through vias 130 may be disposed on all four sides of the edge region ER. A spacing interval 'g' between adjacent through vias 130 may range from between about 0.001 mm to about 1 mm (See, e.g., FIG. 3). And in some embodiments, the number of the through vias 130 provided in relation to the semiconductor chip 100 may range from 1 to 10,000.

Referring to FIG. 5, the through vias 130 need not be disposed along all sides of the edge region ER, nor fully occupy a side. For example, one or more additional elements 140 may be disposed (e.g., horizontally spaced apart) on at least one side of the edge region ER. Hence, the additional elements 140 may be horizontally spaced apart from the device region DR and the circuit wiring pattern 124. Accordingly, the additional elements 140 are not directly connected to the circuit wiring pattern 124. The additional elements 140 may be closer than the circuit wiring pattern 124 to the outer edge of the semiconductor substrate 110. Here, the additional elements 140 may variously include passive elements, such as resistors or capacitors. As one example, the additional elements 140 may include a resistor that vertically penetrates the semiconductor substrate 110 and the circuit layer 120. As another example, the additional elements 140 may include a cylindrical capacitor that vertically penetrates the semiconductor substrate 110 and the circuit layer 120.

In some embodiments, the additional elements 140 may be electrically connected portions of a first redistribution layer 200 disposed on an upper surface of the semiconductor chip 100 with portions of a second redistribution layer 300 disposed on the lower surface of the semiconductor chip 100.

The first redistribution layer 200 may be disposed on the first surface 110*a* of the semiconductor substrate 110. For example, the first redistribution layer 200 may cover the circuit layer 120. The first redistribution layer 200 may cover both of the device region DR and the edge region ER. The first redistribution layer 200 may include one or more first wiring layers, wherein the first wiring layers are vertically stacked one upon the other. Each of the first wiring layers may include a first redistribution dielectric layer 210 and a first redistribution conductive pattern 220 in the first redistribution dielectric layer 210. When multiple first wiring layer are provided, the first redistribution conductive pattern 220 of one first wiring layer may be electrically connected to the first redistribution conductive pattern 220 of another first wiring layer adjacent to the one first wiring layer.

The first redistribution dielectric layer 210 may include, for example, a dielectric polymer or a photo-imageable dielectric (PID), wherein the photo-imageable dielectric may include at least one of photosensitive polyimide (PI), polybenzoxazole (PBO), phenolic polymers, and benzocyclobutene polymers. Alternately, the first redistribution dielectric layer 210 may include a dielectric material, such as silicon oxide (SiO), silicon nitride (SiN), silicon oxynitride (SiON), silicon carbonitride (SiCN), and/or dielectric polymers.

The first redistribution conductive pattern 220 may be provided on the first redistribution dielectric layer 210. The first redistribution conductive pattern 220 may horizontally extend on the first redistribution dielectric layer 210. The first redistribution conductive pattern 220 may be a component for redistribution in the first wiring layer. The first redistribution conductive pattern 220 may be disposed on both of the device region DR and the edge region ER. At least a portion of the first redistribution conductive pattern 220 may be closer than the circuit wiring pattern 124 to the outer edge of the semiconductor substrate 110. For example, a distance from the outer edge of the semiconductor substrate 110 to the first redistribution conductive pattern 220 may be less than a distance from the outer edge of the semiconductor substrate 110 to the circuit wiring pattern 124. The first redistribution conductive pattern 220 may allow electrical connection of the circuit wiring pattern 124 to expand from the device region DR to the edge region ER. The first redistribution conductive pattern 220 may include a conductive material, such as for example, copper (Cu) and aluminum (Al).

The first redistribution conductive pattern 220 may have a damascene structure. For example, the first redistribution conductive pattern 220 may have a head portion and a tail portion that are integrally connected into a unitary element. The head and tail portions of the first redistribution conductive pattern 220 may have an inverse T-shape cross-section.

The head portion of the first redistribution conductive pattern 220 may be a pad or line part that allows a wiring line in the first redistribution layer 200 to horizontally expand. The head portion may be provided on a lower surface of the first redistribution dielectric layer 210. For example, the head portion may protrude from the lower surface of the first redistribution dielectric layer 210. The first redistribution conductive pattern 220 of a lowermost one of the first wiring layers may be exposed on the lower surface of the first redistribution dielectric layer 210. The first redistribution conductive pattern 220 of the lowermost first wiring layer may have a lower surface coplanar with that of the first redistribution dielectric layer 210.

The tail portion of the first redistribution conductive pattern 220 may be a via part for vertical connection of a wiring line in the first redistribution layer 200. The tail portion may be coupled to another first wiring layer that overlies the tail portion. For example, the tail portion of one first redistribution conductive pattern 220 may extend from an upper surface of the head portion of the one first redistribution conductive pattern 220, and may penetrate the first redistribution dielectric layer 210 to be coupled to the head portion of another first redistribution conductive pattern 220 included in another first wiring layer that overlies the tail portion of the one first redistribution conductive pattern 220. The tail portion of the first redistribution conductive pattern 220 included in an uppermost one of the first wiring layers may penetrate the first redistribution dielectric layer 210 to be coupled to the semiconductor chip 100. For example, the first redistribution conductive pattern 220 of the uppermost first wiring layer may be coupled to the exposed wiring portion 124*a* on the device region DR, and may be coupled to the through vias 130 on the edge region ER. The through vias 130, the circuit element 122 of the semiconductor chip 100, and the circuit wiring pattern 124 may be electrically connected to each other through the first redistribution layer 200.

The second redistribution layer 300 may be disposed on the second surface 110*b* of the semiconductor substrate 110. For example, the second redistribution layer 300 may cover the second surface 110*b* of the semiconductor substrate 110. The second redistribution layer 300 may cover both of the device region DR and the edge region ER. The second redistribution layer 300 may include one or more second, vertically-stacked, wiring layers. Each of the second wiring layers may include a second redistribution dielectric layer 310 and a second redistribution conductive pattern 320 in the second redistribution dielectric layer 310. When multiple second wiring layer are provided, the second redistribution conductive pattern 320 of one second wiring layer may be electrically connected to the second redistribution conductive pattern 320 of another second wiring layer adjacent to the one second wiring layer.

The second redistribution dielectric layer 310 may include a dielectric polymer or a photo-imageable dielectric (PID). For example, the photo-imageable dielectric may include at least one of for example, photosensitive polyimide (PI), polybenzoxazole (PBO), phenolic polymers, and benzocyclobutene polymers. Alternately, the second redistribution dielectric layer 310 may include a dielectric material, such as for example, silicon oxide (SiO), silicon nitride (SiN), silicon oxynitride (SiON), silicon carbonitride (SiCN), and/or dielectric polymers.

The second redistribution conductive pattern 320 may be provided on the second redistribution dielectric layer 310. The second redistribution conductive pattern 320 may horizontally extend on the second redistribution dielectric layer 310. The second redistribution conductive pattern 320 may be a component for redistribution in the second wiring layer. The second redistribution conductive pattern 320 may include a conductive material, such as copper (Cu) and aluminum (Al). The second redistribution conductive pattern 320 may have a damascene structure. For example, the second redistribution conductive pattern 320 may have a head portion and a tail portion that are integrally connected into a single unitary piece. The head and tail portions of the second redistribution conductive pattern 320 may have a T-shape cross-section.

The head portion of the second redistribution conductive pattern 320 may be a pad or line part that allows a wiring line in the second redistribution layer 300 to horizontally expand. The head portion may be provided on an upper surface of the second redistribution dielectric layer 310. For example, the head portion may protrude from the upper surface of the second redistribution dielectric layer 310. The second redistribution conductive pattern 320 of an uppermost one of the second wiring layers may be exposed through the upper surface of the second redistribution dielectric layer 310. The second redistribution conductive pattern 320 of the uppermost second wiring layer may be coplanar with the upper surface of the second redistribution dielectric layer 310. A semiconductor package, a semiconductor chip, or an electronic element may be separately mounted on the second redistribution conductive pattern 320 of the uppermost second wiring layer.

The tail portion of the second redistribution conductive pattern 320 may be a via part for vertical connection of a wiring line in the second redistribution layer 300. The tail portion may be coupled to another second wiring layer that underlies the tail portion. For example, the tail portion of one second redistribution conductive pattern 320 may extend from a lower surface of the one second redistribution conductive pattern 320, and may penetrate the second redistribution dielectric layer 310 to be coupled to the head portion of the second redistribution conductive pattern of another second wiring layer that underlies the tail portion of the one second redistribution conductive pattern 320. The tail portion of the second redistribution conductive pattern 320 included in a lowermost one of the second wiring layers may penetrate the second redistribution dielectric layer 310 to be coupled to the through vias 130. For example, the second redistribution conductive pattern 320 of the lowermost second wiring layer may be coupled to the through vias 130 on the edge region ER. The second redistribution layer 300 may be electrically connected through the through vias 130 and the first redistribution layer 200 to the circuit wiring pattern 124 and the circuit element 122 of the semiconductor chip 100. A distance from a lower surface of the first redistribution layer 200 to an upper surface of the second redistribution layer 300 may range from between about 0.03 mm to about 1 mm.

In some embodiments, the first and second redistribution layers 200 and 300 may be respectively provided on lower and upper surfaces of the semiconductor chip 100. In this configuration, the first and second redistribution layers 200 and 300 may be interconnected not by using connection members provided to one side of the semiconductor chip 100 in the device region DR, but rather by using the through vias 130 that directly penetrate the edge region ER of the semiconductor chip 100. This allows the semiconductor chip 100 to occupy a relatively smaller area.

In addition, since the first and second redistribution layers 200 and 300 are connected using through vias 130, no molding member is required to cover (e.g., isolate and/or protect) separately provided connection members. Accordingly, thermal energy (hereafter, "heat") generated by the semiconductor chip 100 may be more readily exhausted from the semiconductor package 10. That is, the process of exhausting the heat generated by the semiconductor chip 100 will not thermally-impeded by the insulating properties of the molding member, but instead, heat may be effectively exhausted from side, upper, and lower surfaces of the semiconductor chip 100. This ability improves the overall thermal radiation properties of the semiconductor package 10.

As noted above, the through vias 130 are not provided in the device region DR which includes the circuit element 122 and the circuit wiring pattern 124 associated with the semiconductor chip 100. Accordingly, an increased freedom of layout related to the circuit element 122, as well as both a freedom of layout and freedom of interconnection related to the circuit wiring pattern 124 may be realized. Such expanded freedom in the layout and interconnection of the circuit element 122 and the circuit wiring pattern 124 may enable further integration of the semiconductor package 10. And as a result, it is possible to provide a more compact semiconductor package with increased integration and improved overall electrical properties.

Referring to FIG. 6, a semiconductor package 11 according to embodiments of the inventive concept may further include one or more components providing external coupling of the semiconductor package 11. For example, as shown in FIG. 6, a substrate protection layer 410 may be additionally disposed on a lower surface of the first redistribution layer 200 to substantially cover the first redistribution dielectric layer 210 and the first redistribution conductive pattern 220. The substrate protection layer 410 may include at least one of; a high density plasma (HDP) oxide, undoped silicate glass (USG), tetraethyl orthosilicate (TEOS), silicon nitride (SiN), silicon oxide (SiO), silicon carboxide (SiOC), silicon oxynitride (SiON), and silicon carbonitride (SiCN). The substrate protection layer 410 may be realized as a mono-layered structure or a multi-layered structure.

One or more external pads 420 may be disposed on a lower surface of the substrate protection layer 410. The external pads 420 may be disposed on at least one of the device region DR and the edge region ER. Thus, while the circuit element 122 and the circuit wiring pattern 124 of the semiconductor substrate 110 may be provided only in the device region DR, in some embodiments, the external pads 420 may be provided in both of the device region DR and the edge region ER. Outermost ones of the external pads 420 may be disposed closer to the outer edge of the semiconductor substrate 110 than the circuit wiring pattern 124. In some embodiments, the external pads 420 may penetrate the substrate protection layer 410 in order to firmly connect to the first redistribution conductive pattern 220 of the first redistribution layer 200. The external pads 420 may serve as pads to which external terminals 430 are coupled. For example, the external pads 420 may correspond to under-bump metals to which the external terminals 430 are bonded.

The external terminals 430 may be respectively and correspondingly provided on lower surfaces of the external terminals 430. The external terminals 430 may be implemented as solder balls and/or solder bumps. And based on a given type for the external terminals 430, the semiconductor package 11 may conform with conventionally understood practices associated with a ball grid array (BGA), a fine ball-grid array (FBGA), or a land grid array (LGA).

Figure 7:
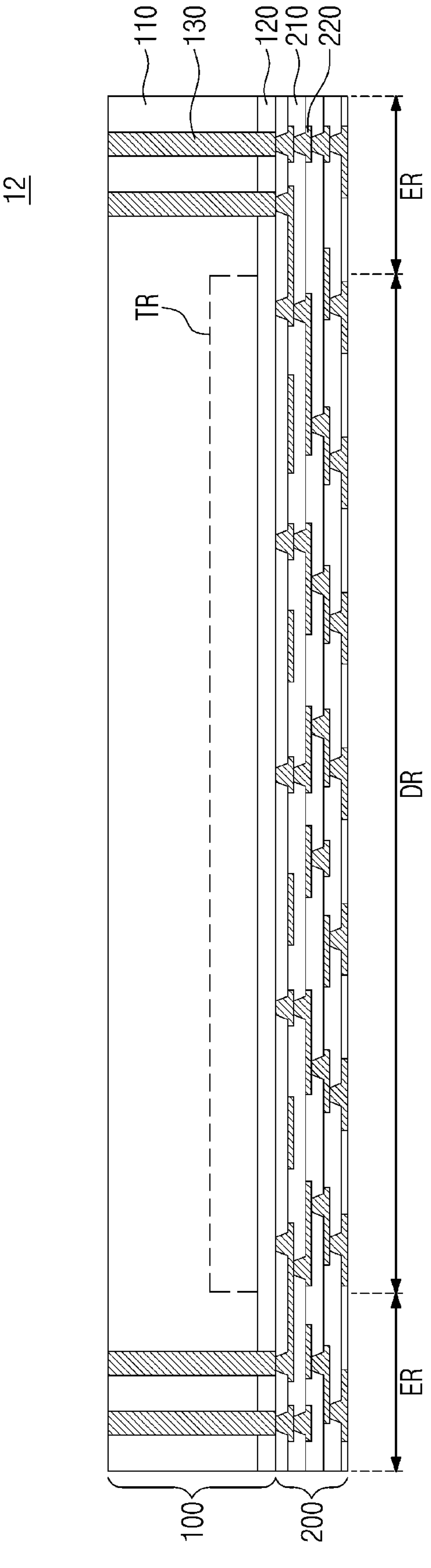
Figure 8:
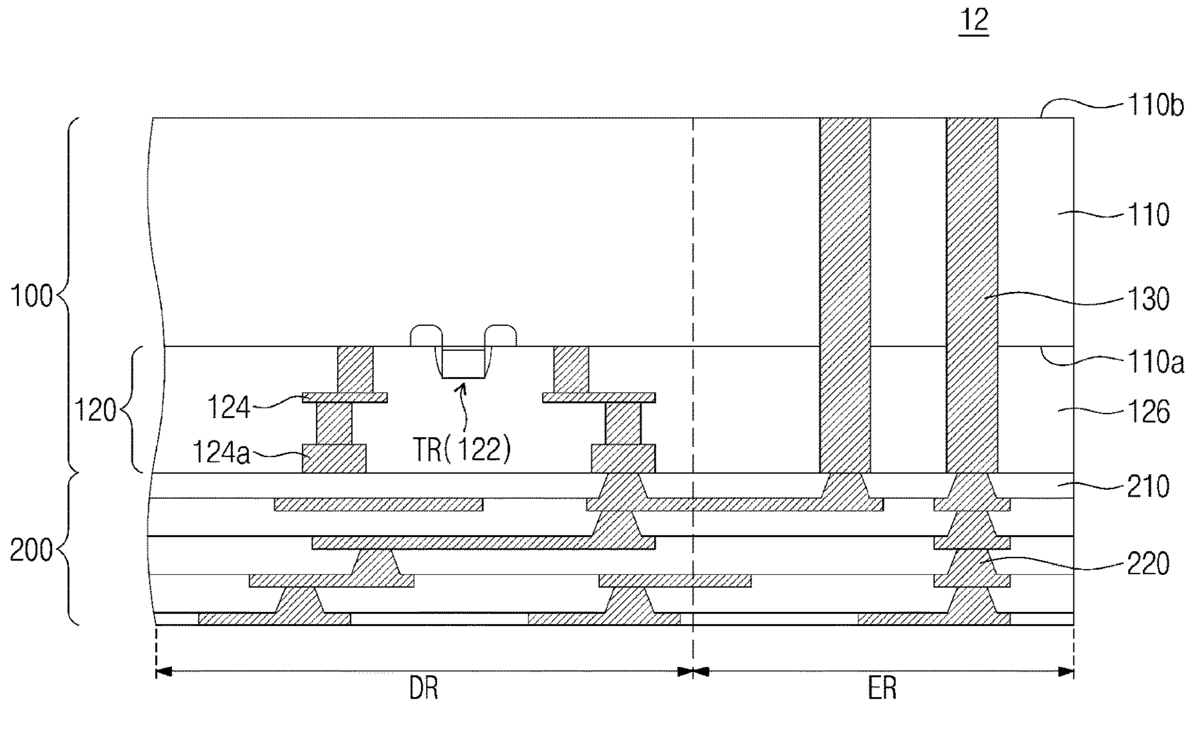
FIG. 8 is an enlarged cross-sectional view further illustrating, in part, the semiconductor package 12 of FIG. 7.

FIG. 7 is a cross-sectional view illustrating a semiconductor package 12 according to embodiments of the inventive concept, and FIG. 8 is an enlarged cross-sectional view further illustrating, in part, the semiconductor package 12 of FIG. 7. Here, FIGS. 7 and 8 may be compared with FIGS. 1 and 2, and only material differences will be described.

Of note, the semiconductor package 12 of FIGS. 7 and 8 does not include the second redistribution layer 300 of the semiconductor package 10 of FIGS. 1 and 2. Accordingly, respective upper surfaces of the through vias 130 as well as the second surface **110*b* of the semiconductor substrate 110** may be exposed. This configuration allows another semiconductor package, another semiconductor chip, or various elements and/or components to be selectively mounted thereon.

Figure 9:
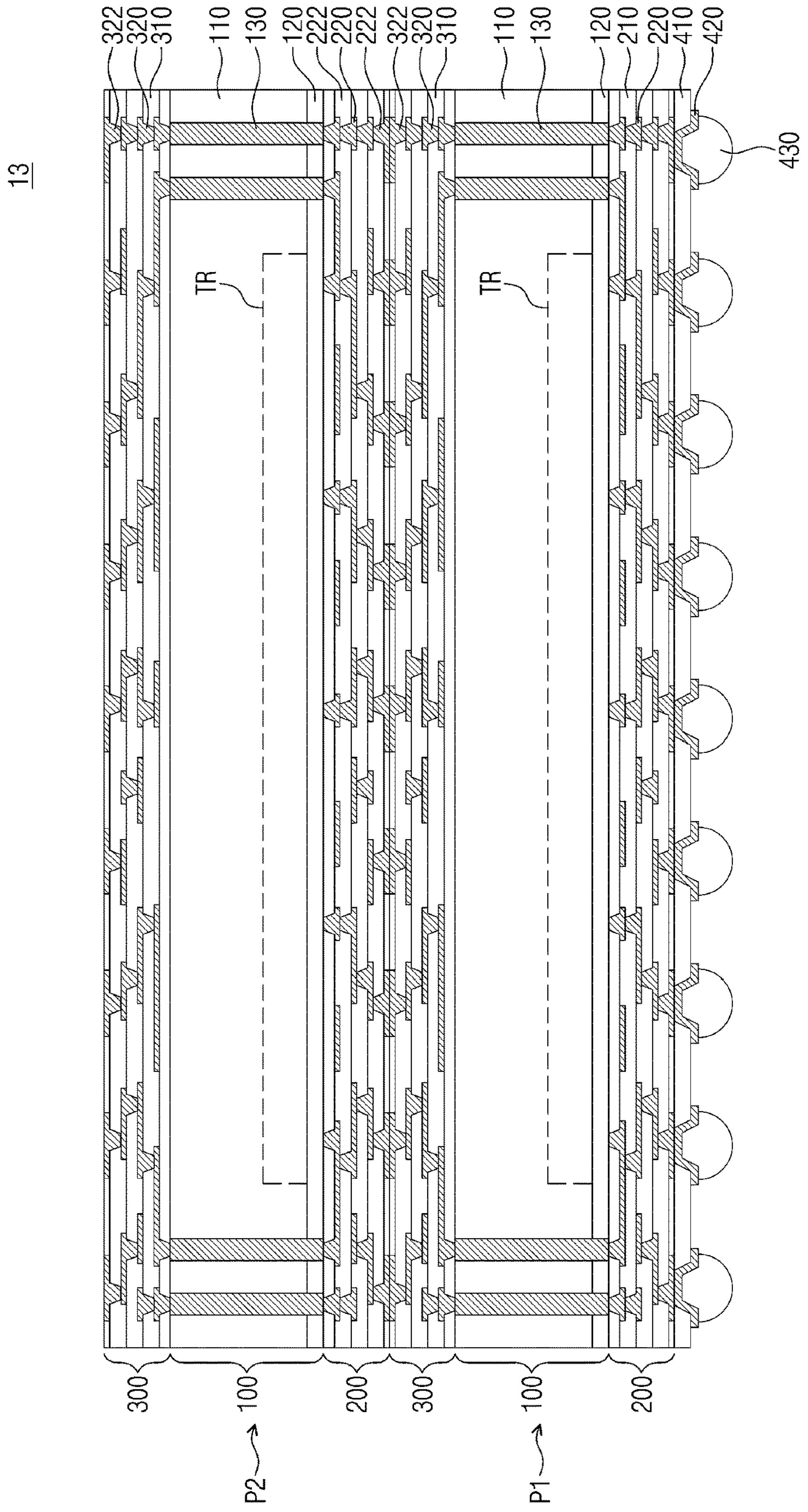
FIG. 9 is a cross-sectional view illustrating a semiconductor package 13 according to embodiments of the inventive concept.
Figure 10:
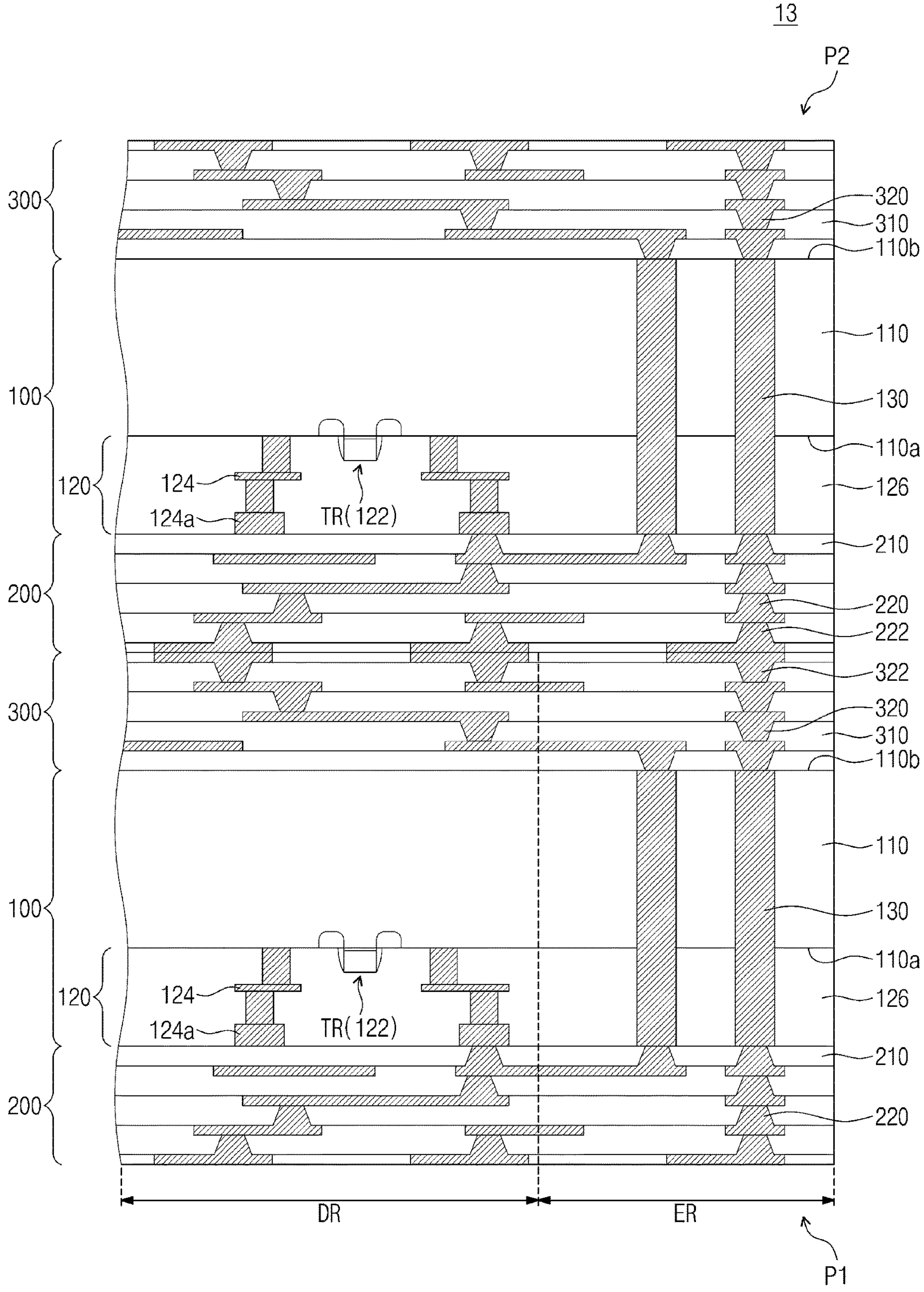
FIG. 10 is an enlarged cross-sectional view further illustrating, in part, the semiconductor package 13 of FIG. 9.

FIG. 9 is a cross-sectional view illustrating a semiconductor package 13 according to embodiments of the inventive concept, and FIG. 10 is an enlarged cross-sectional further illustrating, in part, the semiconductor package 13 of FIG. 9.

Referring to FIGS. 9 and 10, the semiconductor package 13 may include a vertically stacked plurality of first and second semiconductor packages P1 and P2.

Here, in some embodiments, the first package P1 may be substantially similar to the semiconductor package 11 of FIG. 6. That is, the first package P1 may include the semiconductor chip 100, the first redistribution layer 200 on the lower surface of the semiconductor chip 100, the second redistribution layer 300 on the upper surface of the semiconductor chip 100, and a substrate protection layer 410, external pads 420, and external terminals 430 disposed below the first redistribution layer 200. As before, the semiconductor chip 100 may include the semiconductor substrate 110, the circuit element 122 on an active surface

110*a* (e.g., the first surface 100*a*) in a device region DR, the circuit wiring pattern 124 connected to the circuit element 122 in the device region DR, a device interlayer dielectric layer 126 covering the circuit wiring pattern 124 and the circuit element 122 on the active surface 110*a* of the semiconductor substrate 110, and through vias 130 penetrating the semiconductor substrate 110 and the device interlayer dielectric layer 126 to connect the first redistribution layer 200 and the second redistribution layer 300 in an edge region ER of the semiconductor substrate 110. The second redistribution conductive pattern 320 may include the exposed portion 322 on an upper surface of the second redistribution layer 300, and the portion 322 corresponding to upper pads 322 on which the second package P2 may be mounted.

Here, the upper pads 322 may each have a width ranging from between about 0.5 μm to about 20 μm, and separated by an interval ranging from between about 0.5 μm to about 20 μm.

Alternately, the first package P1 may be substantially similar to the semiconductor package 10 of FIGS. 1 and 2. That is, the first package P1 may not include any of the substrate protection layer 410, the external pads 420, and the external terminals 430 below the first redistribution layer 200.

Alternately, the first package P1 may be substantially similar to the semiconductor package 12 of FIGS. 7 and 8. That is, the first package P1 may omit the second redistribution layer 300 from the second surface 110*b* of the semiconductor substrate 110. In this case, upper portions of the through vias 130 may be exposed through an upper surface of the semiconductor substrate 110, wherein the exposed upper portions of the through vias 130 may correspond respectively to pads on which the second package P2 may be mounted.

In the context of the semiconductor package 13 of FIGS. 9 and 10, the second package P2 may be substantially similar to the semiconductor package 10 of FIGS. 1 and 2. That is, the second package P2 may include the semiconductor chip 100, the first redistribution layer 200 on the lower surface of the semiconductor chip 100, and the second redistribution layer 300 on the upper surface of the semiconductor chip 100. As before, the semiconductor chip 100 may include the semiconductor substrate 110, the circuit element 122 formed on the active surface 110*a* in a device region DR, the circuit wiring pattern 124 connected to the circuit element 122 in the device region DR, the device interlayer dielectric layer 126 substantially covering the circuit wiring pattern 124 and the circuit element 122 on the active surface 110*a* of the semiconductor substrate 110, and through vias 130 penetrating the semiconductor substrate 110 and the device interlayer dielectric layer 126 to connect the first redistribution layer 200 and the second redistribution layer 300 in an edge region ER. Here, the first redistribution conductive pattern 220 may include portions 222 on the lower surface of the first redistribution layer 200, wherein portions 222 of the first redistribution conductive pattern 220 correspond respectively to lower pads 222 on which the second package P2 may be mounted. Here again, the lower pads 222 may have a width ranging from between about 0.5 μm to about 20 μm, and may be separated by an interval ranging from between about 0.5 μm to about 20 μm.

The second package P2 may be variously mounted on the first package P1, such that the upper pads 322 of the second redistribution layer 300 of the first package P1 are vertically aligned with the lower pads 222 of the first redistribution layer 200 of the second package P2. Once proper alignment is achieved, the first package P1 and the second package P2 may be disposed in contact, ready for bonding.

Hence, on an interface between the first package P1 and the second package P2, the second redistribution dielectric layer 310 of the second redistribution layer 300 in the first package P1 may be bonded to the first redistribution dielectric layer 210 of the first redistribution layer 200 in the second package P2. In this case, the bonding of the second redistribution dielectric layer 310 and the first redistribution dielectric layer 210 may constitute a hybrid bonding of oxide, nitride, and/or oxynitride. In this regard, the term "hybrid bonding" denotes a bonding approach in which two or more components of like kind (e.g., oxide, nitride, metal, etc.) at least partially merge at an interface therebetween. For example, the second redistribution dielectric layer 310 and the first redistribution dielectric layer 210 bonded together, thereby forming a continuous invisible boundary between the second redistribution dielectric layer 310 and the first redistribution dielectric layer 210. Thus, assuming that the second redistribution dielectric layer 310 and the first redistribution dielectric layer 210 are formed of the same material, no discernable interface will be present between the second redistribution dielectric layer 310 and the first redistribution dielectric layer 210.

However, those skilled in the art will appreciate that hybrid bonding is just one of several approaches that may be used to effectively mount (e.g., electrically connect and/or mechanically assemble) the second package P2 on the first package P1.

In some embodiments, one or more conductive interface(s) between the first package P1 and the second package P2 (e.g., upper pads 322 of the second redistribution layer 300 in the first package P1 and lower pads 222 of the first redistribution layer 200 in the second package P2) may be used to effect mount the second package P2 on the first package P1. For example, assuming the foregoing configuration, the upper pads 322 and the lower pads 222 may undergo an intermetallic hybrid bonding. Accordingly, the upper pads 322 and the lower pads 222—having the same material—may be bonded together without discernable material boundary.

Figure 11:
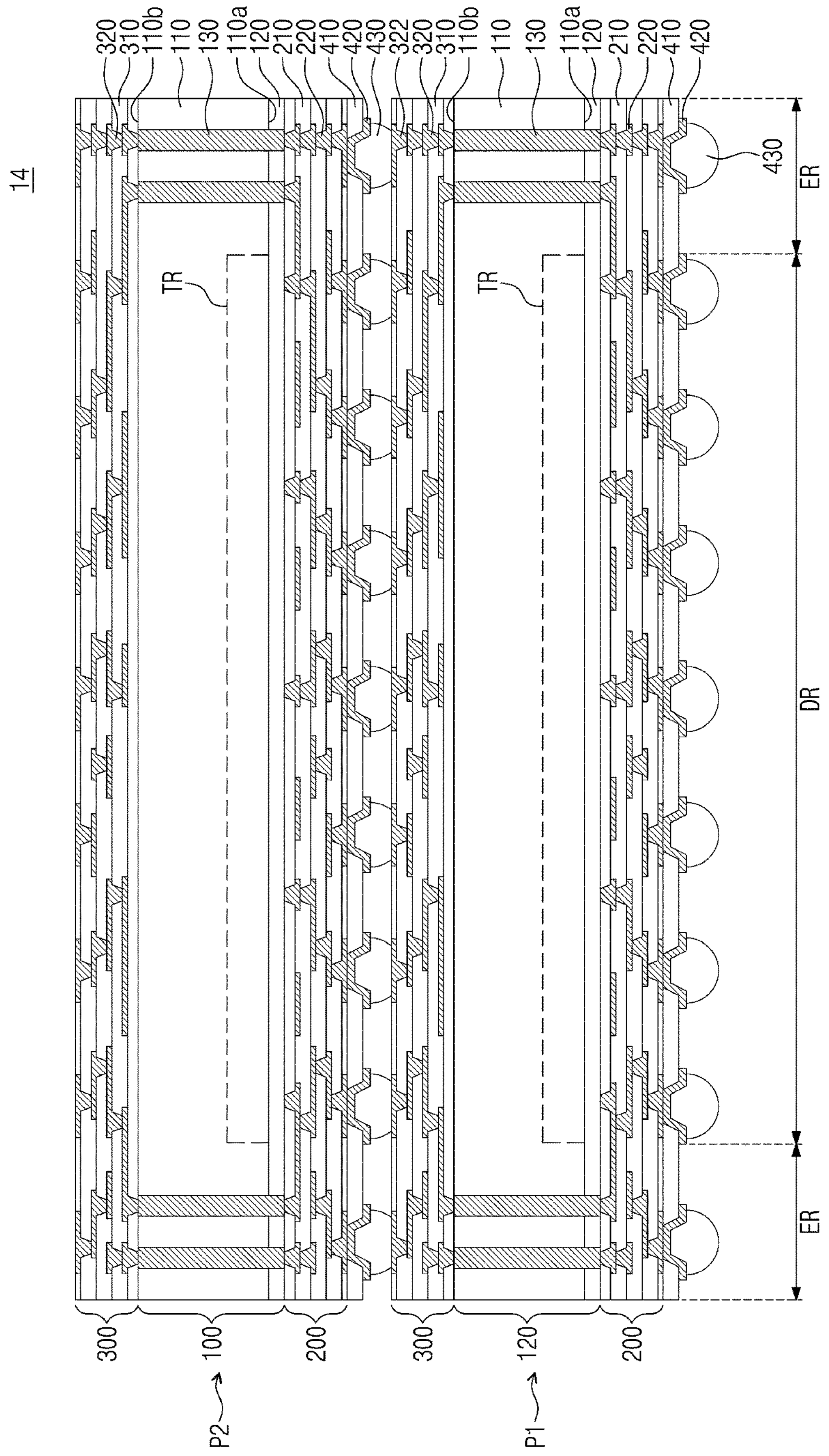
FIGS. 11, 12, 13 and 14 are respective cross-sectional views illustrating various semiconductor packages according to embodiments of the inventive concept.

FIG. 11 is a cross-sectional view illustrating a semiconductor package 14 according to embodiments of the inventive concept.

Referring to FIG. 11, the first package P1 may be substantially similar to the semiconductor package 11 of FIG. 6. That is, the first package P1 may include the semiconductor chip 100, the first redistribution layer 200 on the lower surface of the semiconductor chip 100, the second redistribution layer 300 on the upper surface of the semiconductor chip 100, wherein the substrate protection layer 410, external pads 420, and external terminals 430 are provided below the first redistribution layer 200. The semiconductor chip 100 may include the semiconductor substrate 110, the circuit element 122 on an active surface 110*a* in the device region DR, the circuit wiring pattern 124 connected to the circuit element 122 in the device region DR, the device interlayer dielectric layer 126 substantially covering the circuit wiring pattern 124 and the circuit element 122 on the active surface 110*a* of the semiconductor substrate 110, and through vias 130 penetrating the semiconductor substrate 110 and the device interlayer dielectric layer 126 to connect the first redistribution layer 200 and the second redistribution layer 300 in the edge region ER. The second redistribution conductive pattern 320 may have the portion 322 exposed through an upper surface of the second redistribution layer 300, and the portion 322 of the second redistribution conductive pattern 320 may correspond to upper pads 322 on which the second package P2 may be mounted.

The second package P2 may also be substantially similar to the semiconductor package 11 of FIG. 6.

Accordingly, the second package P2 may be mounted on the first package P1. For example, the second package P2 may be disposed on the first package P1, such that the upper pads 322 of the second redistribution layer 300 of the first package P1 are vertically aligned with the external pads 420 of the second package P2. Here, the first package P1 and the second package P2 may be vertically spaced apart from each other.

Once properly aligned, the first package P1 and the second package P2 may be connected to each other using (e.g.,) a hybrid bonding approach. For example, the external terminals 430 of the second package P2 may be interposed between the upper pads 322 of the first package P1 and the external pads 420 of the second package P2. The external terminals 430 may connect the upper pads 322 of the first package P1 to the external pads 420 of the second package P2.

An under-fill member (not shown) may be provided between the first package P1 and the second package P2, wherein the under-fill member may substantially surround the external terminals 430 while in-filling the space between the first package P1 and the second package P2.

FIGS. 9 and 10 illustrate a semiconductor package 13, wherein first and second packages P1 and P2 of similar size and configuration are vertically aligned and vertically stacked one on top of the other. In contrast, FIGS. 12 and 13 are respective cross-sectional views illustrating semiconductor packages 15 and 16 according to embodiments of the inventive concept, wherein at least two stacked packages are not of same size and configuration and are not vertically aligned.

Figure 12:
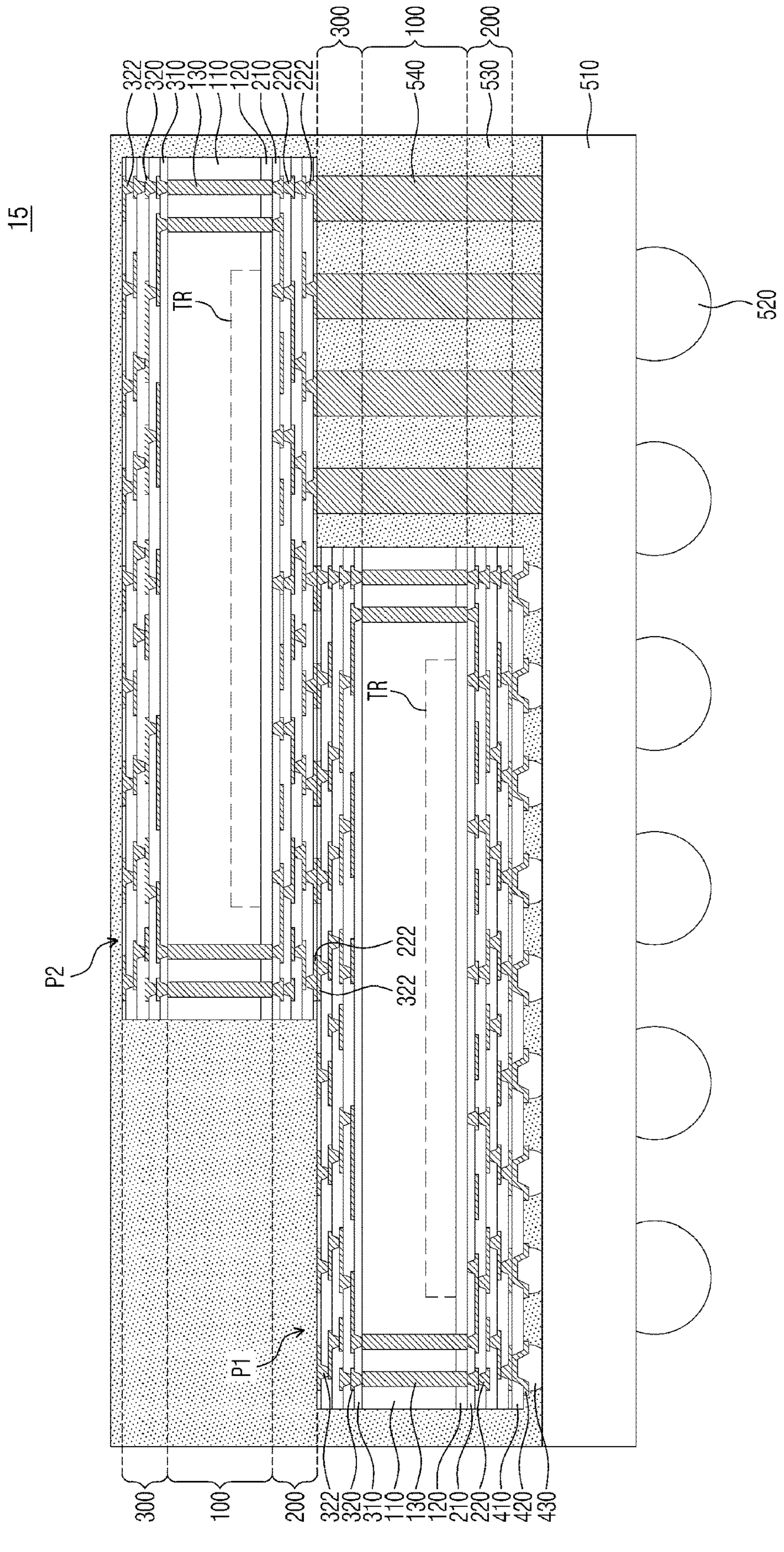
Figure 13:
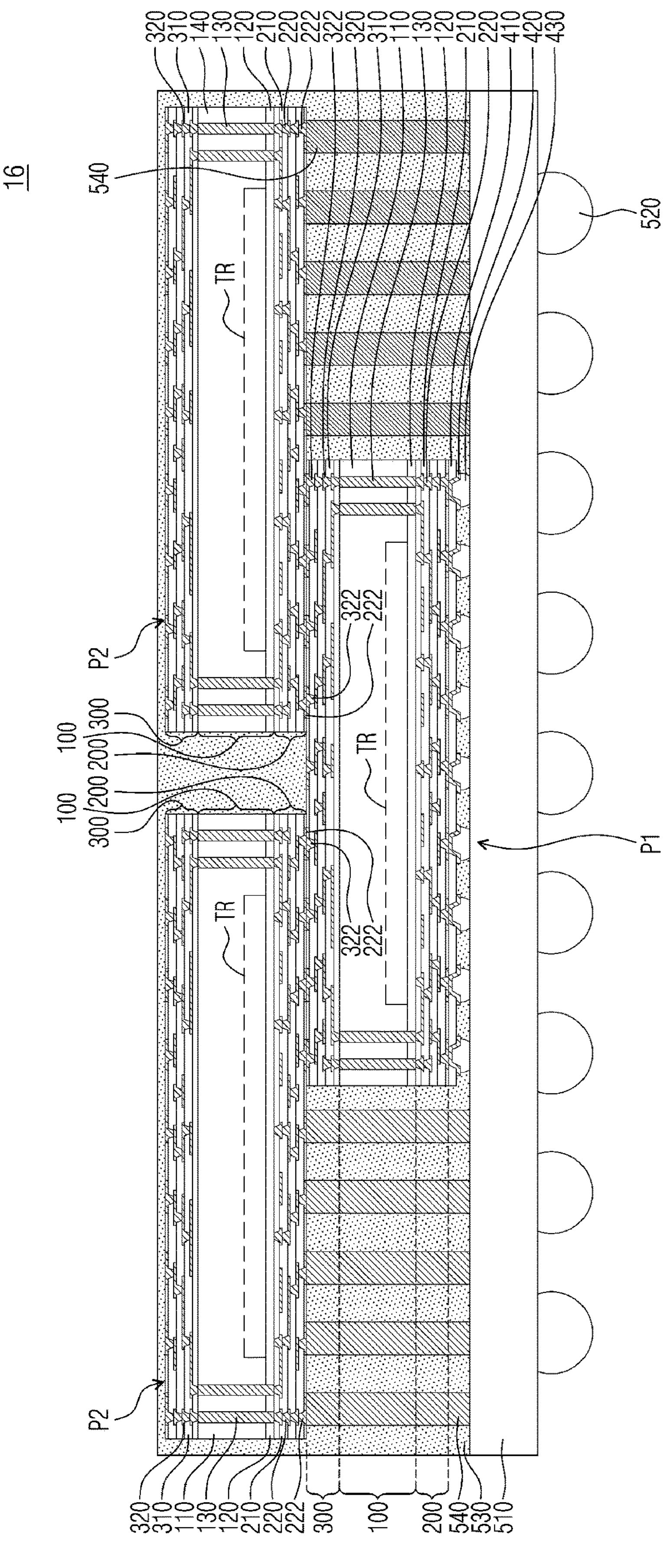

Referring to FIG. 12, the semiconductor package 15 includes a package substrate 510, such as a printed circuit board (PCB) having a signal pattern (not shown) on an upper surface thereof. The package substrate 510 may further include substrate terminals 520 (e.g., solder balls, conductive bumps or conductive lands). In some embodiments, the substrate terminals 520 may be configured as a ball grid array (BGA), a fine ball-grid array (FBGA), or a land grid array (LGA).

The first (or lower) package P1 in the semiconductor package 15 may be substantially similar to the semiconductor package 11 of FIG. 6, and may be mounted on the package substrate 510 using (e.g.,) a flip-chip mounting technique. External terminals 430 associated with the first package P1 may be respectively connected to the signal pattern provided on an upper surface of the package substrate 510.

The semiconductor package 15 may further include conductive posts 540 disposed horizontally adjacent to at least one side of the first package P1 on the package substrate 510. Hence, the conductive posts 540 may be horizontally spaced apart from a side surface of the first package P1. Each of the conductive posts 540 may have a pillar shape that extends in a direction substantially perpendicular to the upper surface of the package substrate 510. The conductive posts 540 may be variously connected to the signal pattern of the package substrate 510. In some embodiments, the respective upper surfaces of the conductive posts 540 may be disposed at the same level as an upper surface of the first package P1. (In this context the term "level" denotes a distance, usually measured in the third (or vertical) direction, relative to an arbitrarily selected reference (e.g., a horizontal surface or point, such as the upper surface of the package substrate 510). The conductive posts 540 may include at least one metallic material, such as copper (Cu) and tungsten (W). Although not shown, each of the conductive posts 540 may include a seed layer variously disposed on bottom and/or side surfaces.

The second package P2 may be disposed on the first package P1 and the upper surfaces of the conductive posts 540. The second package P2 may be substantially the same as the semiconductor package 10 of FIGS. 1 and 2. Thus, the second package P2 may be disposed on the second redistribution layer 300 of the first package P1. Here, however, the second package P2 and the first package P1 may be disposed in an offset stack structure. For example, the first package P1 and the second package P2 may be horizontally offset in at least one of the first horizontal direction D1 and the second horizontal direction D2, such that upper surfaces of the first package P1 and the second package P2 form a stair-step structure.

Thus, a first portion of the second package P2 may overlap the first package P1, while a second portion of the second package P2 may horizontally extend (or protrude) beyond a side surface of the first package P1.

A lower surface of the second package P2 may be substantially parallel with the upper surface of the package substrate 510, as the second package P2 may be mounted at least partially on the upper surface of the first package P1 and also on the upper surfaces of the conductive posts 540.

At least some of the upper pads 322 of the second redistribution layer 300 of the first package P1 may be vertically aligned with the lower pads 222 of the first redistribution layer 200 of the second package P2. In this manner, the first package P1 and the conductive posts 540 may contact with the second package P2.

Once properly disposed and placed in contact, the first package P1 and the second package P2 may be bonded together using (e.g.,) a hybrid bonding approach. Accordingly, at respective interface(s) between the first package P1 and the second package P2, the upper pads 322 of the second redistribution layer 300 of the first package P1 may be bonded to the lower pads 222 of the first redistribution layer 200 of the second package P2. In this regard, the upper pads 322 of the first package P1 may be at least partially merged with the lower pads 222 of the second package P2 using (e.g.,) an intermetallic hybrid bonding approach.

The conductive posts 540 may also be connected to the second package P2. For example, upper surfaces of the conductive posts 540 may respectively be placed in contact with lower pads 222 of the first redistribution layer 200 included in the second package P2 and then bonded using (e.g.,) an intermetallic hybrid bonding approach. Alternately, the conductive posts 540 may be respectively connected through connection terminals (e.g., solder balls) to the lower pads 222 of the second package P2.

Hence, the second package P2 may be electrically connected to the package substrate 510 through the conductive posts 540 or through the first redistribution layer 200, the through vias 130, and the second redistribution layer 300 of the first package P1. And since the second package P2 is connected to the package substrate 510 through not only the conductive posts 540, but also the first package P1, the total number of the conductive posts 540 required to mount of the second package P2 may be reduced, thereby enabling a decrease in the overall size of the semiconductor package 15.

Additionally, a molding layer 530 (e.g., a dielectric polymer, such as an epoxy molding compound (EMC)) may be provided on the package substrate 510 to cover exposed portions of the package substrate 510 and substantially encompass the conductive posts 540, the first package P1, and the second package P2. Thus, in some embodiments, the molding layer 530 may cover side and upper surfaces of each of the first package P1 and the second package P2. Alternately, the molding layer 530 may expose the upper surface of the second package P2. On one side of the first package P1, the molding layer 530 may fill a space between the package substrate 510 and the second package P2. The molding layer 530 may substantially encompass the conductive posts 540 between the package substrate 510 and the second package P2.

In some embodiments multiple second packages P2 may horizontally disposed and vertically stacked on the first package P1. For example, FIG. 13 is a cross-sectional view illustrating a semiconductor package 16 including multiple (e.g., first and second) second packages P2 disposed in a horizontally (or laterally) offset stack structure on top of the first package P1.

In this regard, a first one of the second packages P2 may be stacked on the first package P1 and horizontally offset in one direction, and a second one of the second packages P2 may be stacked on the first package P1 and horizontally offset in another direction. Thus, the first one of the second packages P2 may extend beyond one side surface of the first package P1 and the second one of the second packages P2 may extend beyond another side surface of the first package P1 opposing the one side surface.

The semiconductor package 16 may include the package substrate 510, as well as conductive posts 540. Here, however, The conductive posts 540 may be horizontally disposed on either side (or both sides) of the first package P1. For example, a first group of conductive posts 540 may be disposed to one side of the first package P1, and may be used to electrically connect the package substrate 510 and the first one of the second packages P2. Additionally, a second group of conductive posts 540 may be disposed to another side of the first package P1 opposing the one side, and may be used to electrically connect the package substrate 510 and the second one of the second packages P2.

Here again, the molding layer 530 may be provided on the package substrate 510 to substantially surround the conductive posts 540, the first package P1, and the second packages P2. Thus, the molding layer 530 may fill space(s) between the package substrate 510 and the second packages P2, and surround the conductive posts 540 between the package substrate 510 and the second packages P2.

Figure 14:
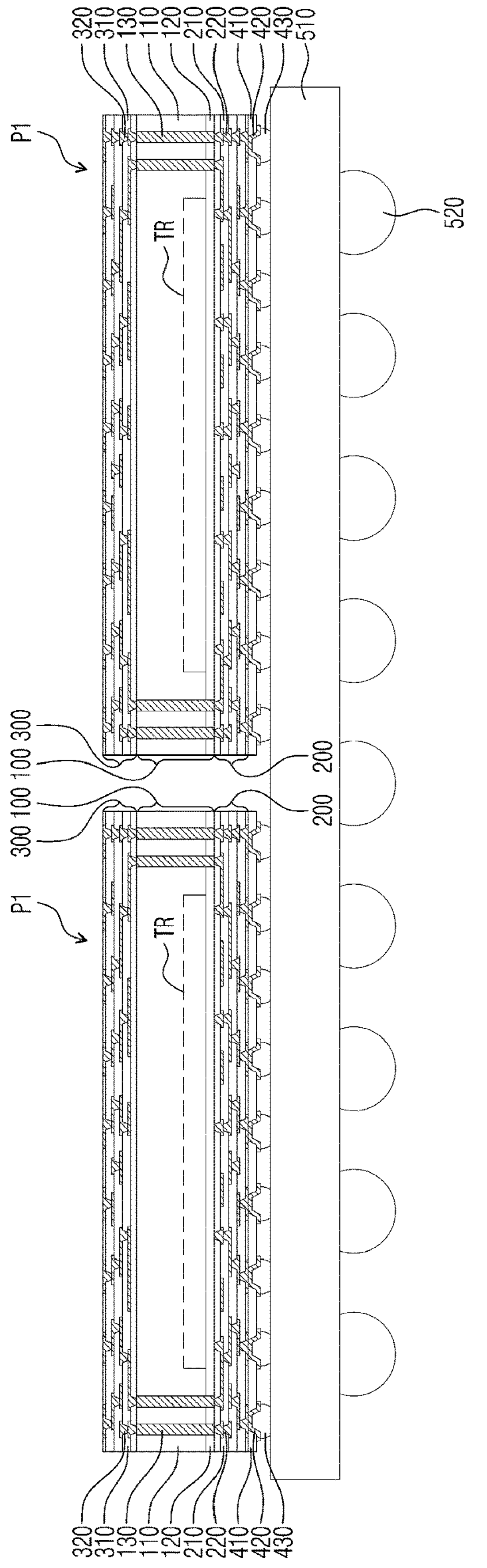

FIG. 14 is a cross-sectional view illustrating a semiconductor package 17 according to embodiments of the inventive concept.

Referring to FIG. 14, the package substrate 510 and the substrate terminals 520 may be provide as described above. However, instead of vertically stacked packages (P1, P2) like those described in FIGS. 12 and 13, multiple first packages P1 may be disposed on the upper surface of the package substrate 510. Each of the first packages P1 may be substantially similar to the semiconductor package 11 of FIG. 6. The first packages P1 may be horizontally spaced apart from one another on the package substrate 510 and respectively mounted on the package substrate 510 using (e.g.,) a flip-chip mounting approach. Here, the respective external terminals 430 of each first package P1 may be electrically connected to the signal pattern on the package substrate 510.

FIGS. 15A to 20A are related cross-sectional views illustrating in one example a method of fabricating semiconductor packages according to embodiments of the inventive concept.

Figure 15A:
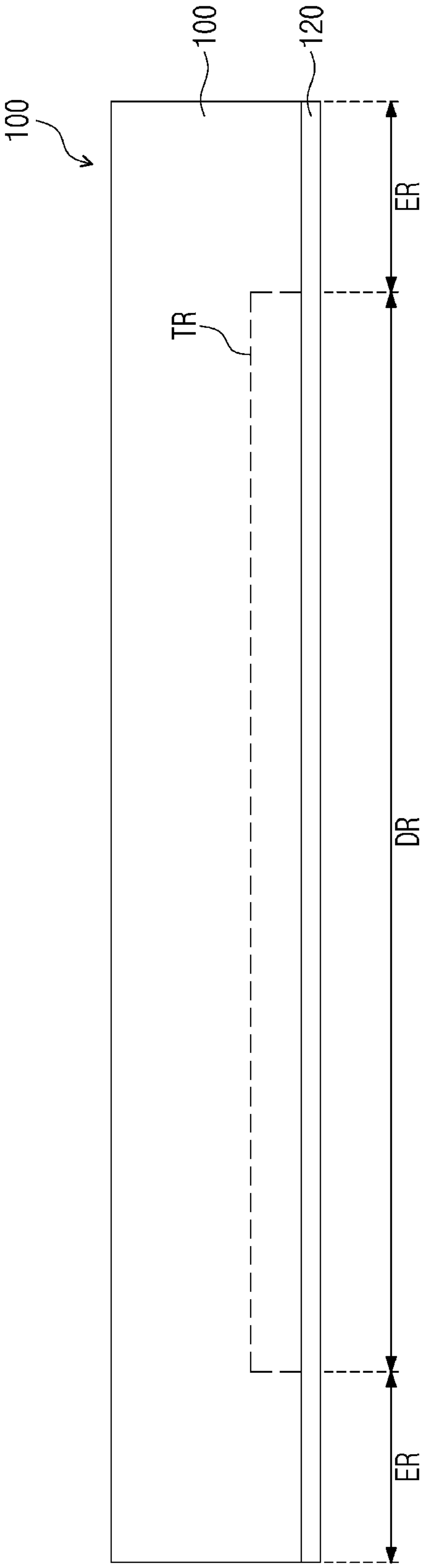
FIGS. 15A, 15B, 16A, 16B, 17A, 17B, 18A, 18B, 19A, 19B, 20A and 20B (hereafter collectively, "FIGS. 15A to 20B") are variously related cross-sectional views illustrating in one example a method of fabricating a semiconductor package according to embodiments of the inventive concept.
Figure 15B:
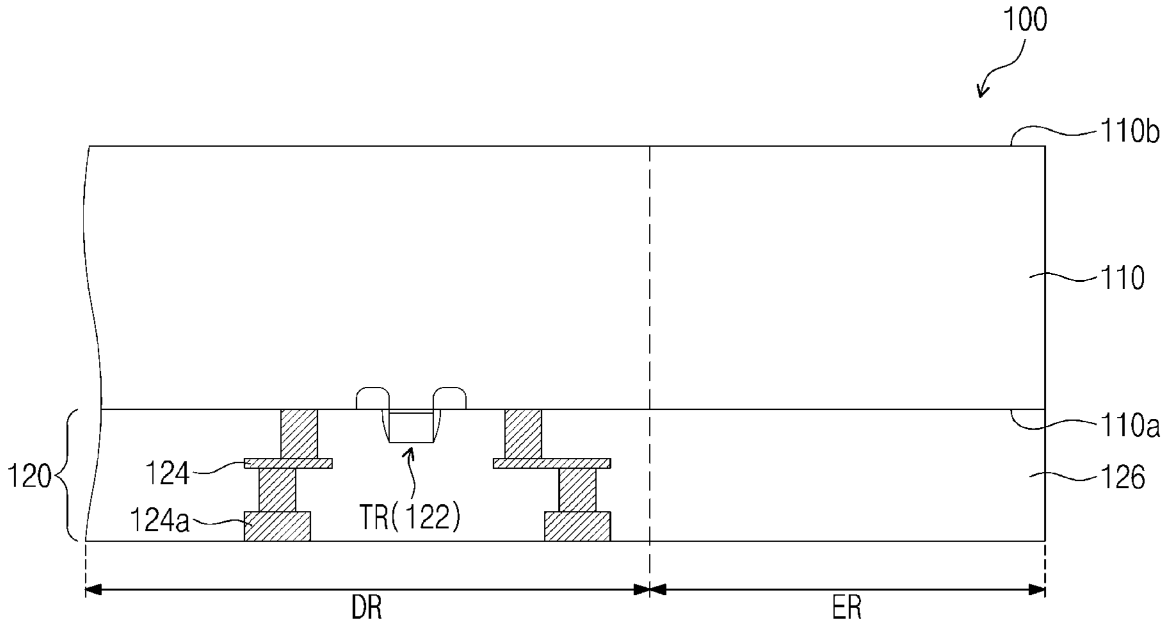

Referring to FIGS. 15A and 15B, a wafer is provided and may be used as a foundation for the semiconductor substrate 110. The circuit element 122 may then be formed a front surface 110*a* of the semiconductor substrate 110. For example, a transistor (TR) may be formed by forming a source and a drain on an upper portion of the semiconductor substrate 110, and forming a gate dielectric layer and a gate electrode between the source and the drain. As described above, the circuit element 122, regardless of particular configuration, will be formed on the device region DR of the semiconductor substrate 110.

The device interlayer dielectric layer 126 and the circuit wiring pattern 124 may also be formed on the semiconductor substrate 110. For example, at least one dielectric material may be deposited on the front surface 110*a* of the semiconductor substrate 110, thereby forming a lower portion of the device interlayer dielectric layer 126. Connection contacts may be formed to penetrate the lower portion of the device interlayer dielectric layer 126 to connect the semiconductor substrate 110, and the circuit wiring pattern 124 may be formed in the lower portion of the device interlayer dielectric layer 126. The circuit wiring pattern 124 may be formed in the device region DR, but not on the edge region ER. At least one dielectric material may be deposited on the lower portion of the device interlayer dielectric layer 126 to form an upper portion of the device interlayer dielectric layer 126. Connection contacts may be formed to penetrate the device interlayer dielectric layer 126 to variously connect with the circuit wiring pattern 124. Thus, the circuit layer 120 may include the circuit element 122, the circuit wiring pattern 124, and the device interlayer dielectric layer 126.

Figure 16A:
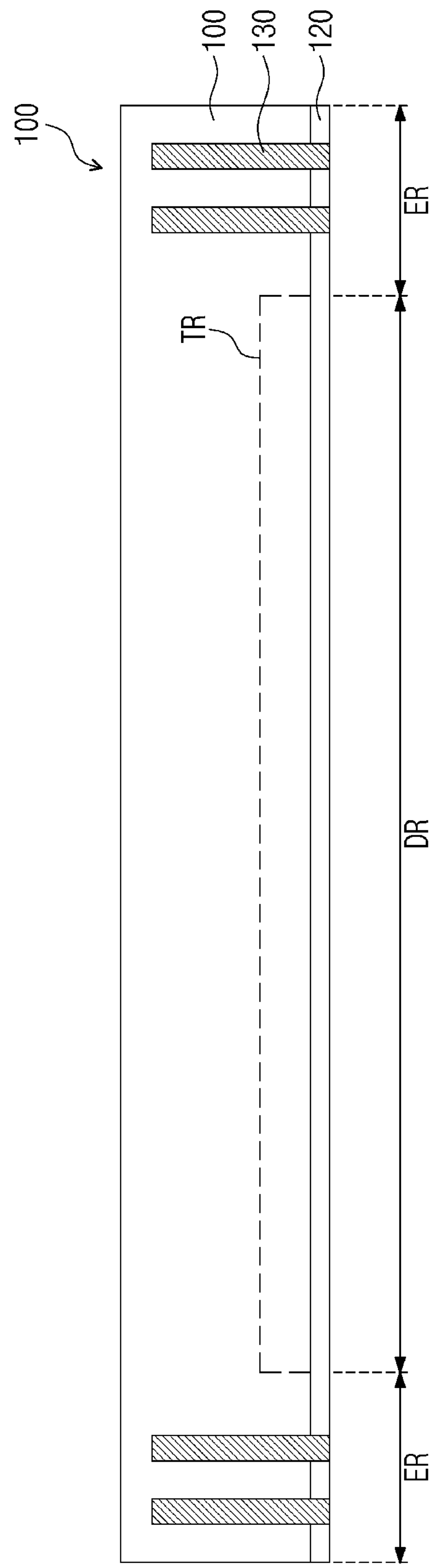
Figure 16B:
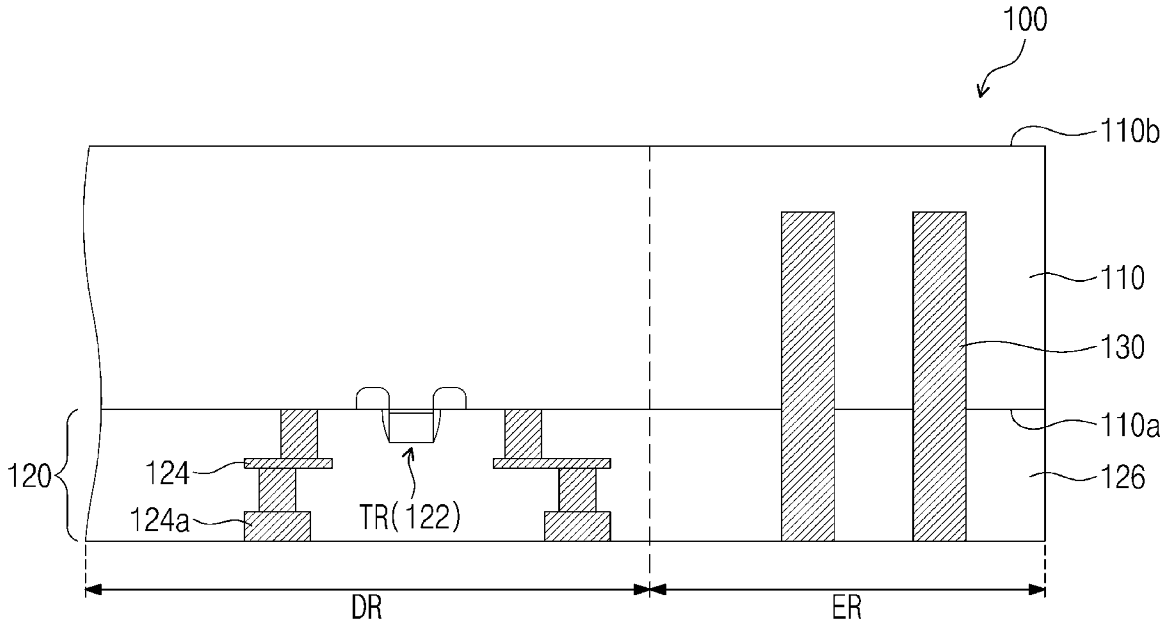

Referring to FIGS. 16A and 16B, through vias 130 may be formed to vertically penetrate the device interlayer dielectric layer 126. For example, in the edge region ER, via holes may be selectively formed in the device interlayer dielectric layer 126, and the via holes may then be filled with at least one conductive material to form the through vias 130. Here, the be through vias 130 are formed in the edge region ER, but not in the device region DR. The via holes may not completely penetrate the device interlayer dielectric layer 126. For example, the through vias 130 may be exposed through an upper surface (or a first surface) 110*a* of the semiconductor substrate 110, but may not be exposed on an opposing rear surface 110*b* (or a second surface) of the semiconductor substrate 110.

Figure 17A:
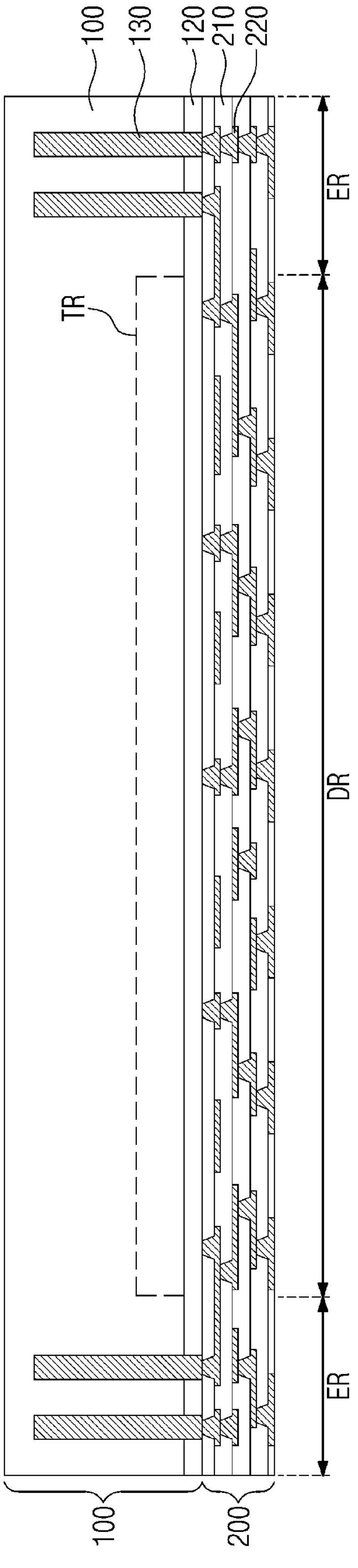
Figure 17B:
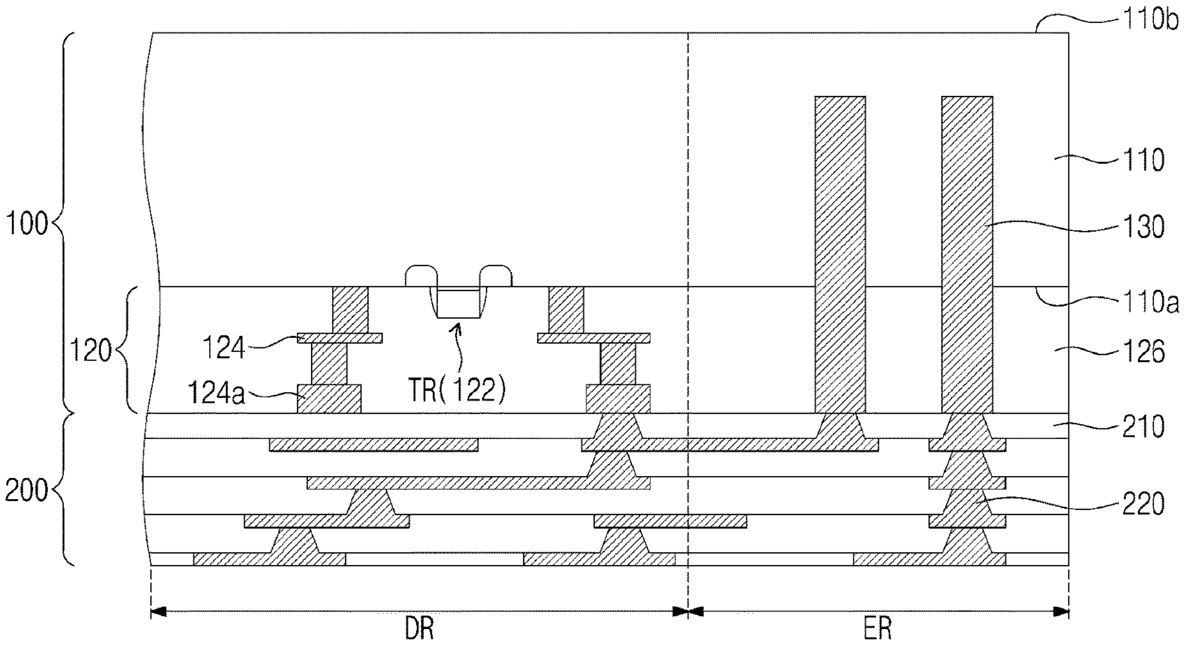

Referring to FIGS. 17A and 17B, the first redistribution layer 200 may be formed on the circuit layer 120. For example, a dielectric layer may be formed on a lower surface of the circuit layer 120, the dielectric layer may be patterned to form a first redistribution dielectric layer 210, a conductive layer may be formed on the first redistribution dielectric layer 210, and the conductive layer may be patterned to form a first redistribution conductive pattern 220, with the result that one first wiring layer may be formed. The formation of the first wiring layer may be repeatedly performed to form the first redistribution layer 200. The first redistribution conductive pattern 220 of a lowermost one of the first wiring layers may correspond to a lower pad of the first redistribution layer 200.

Figure 18A:
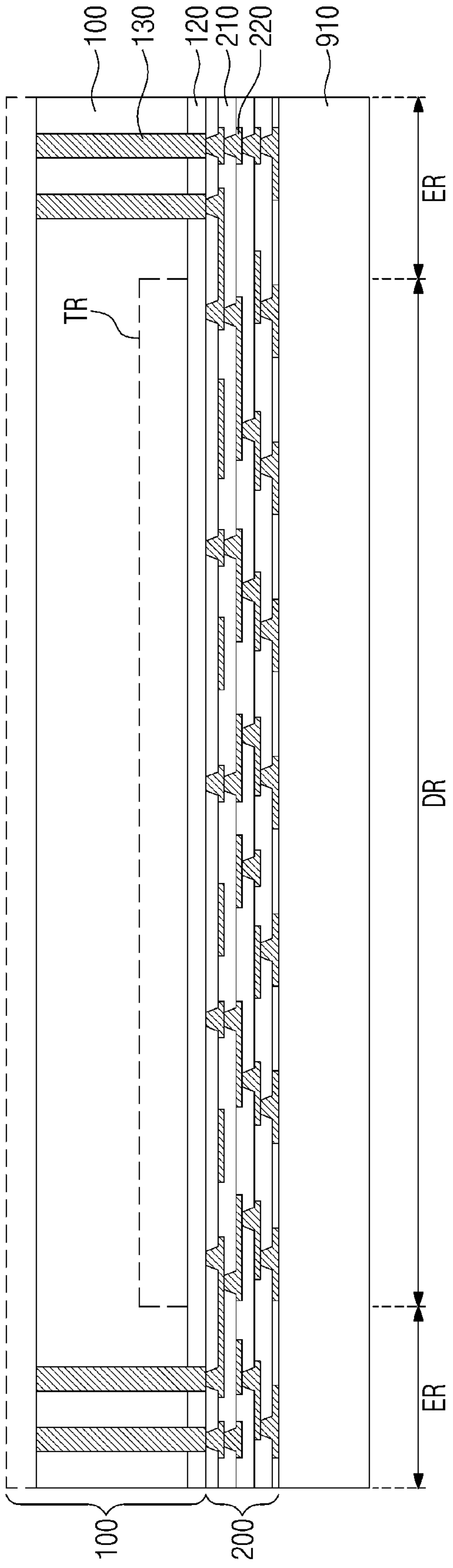
Figure 18B:
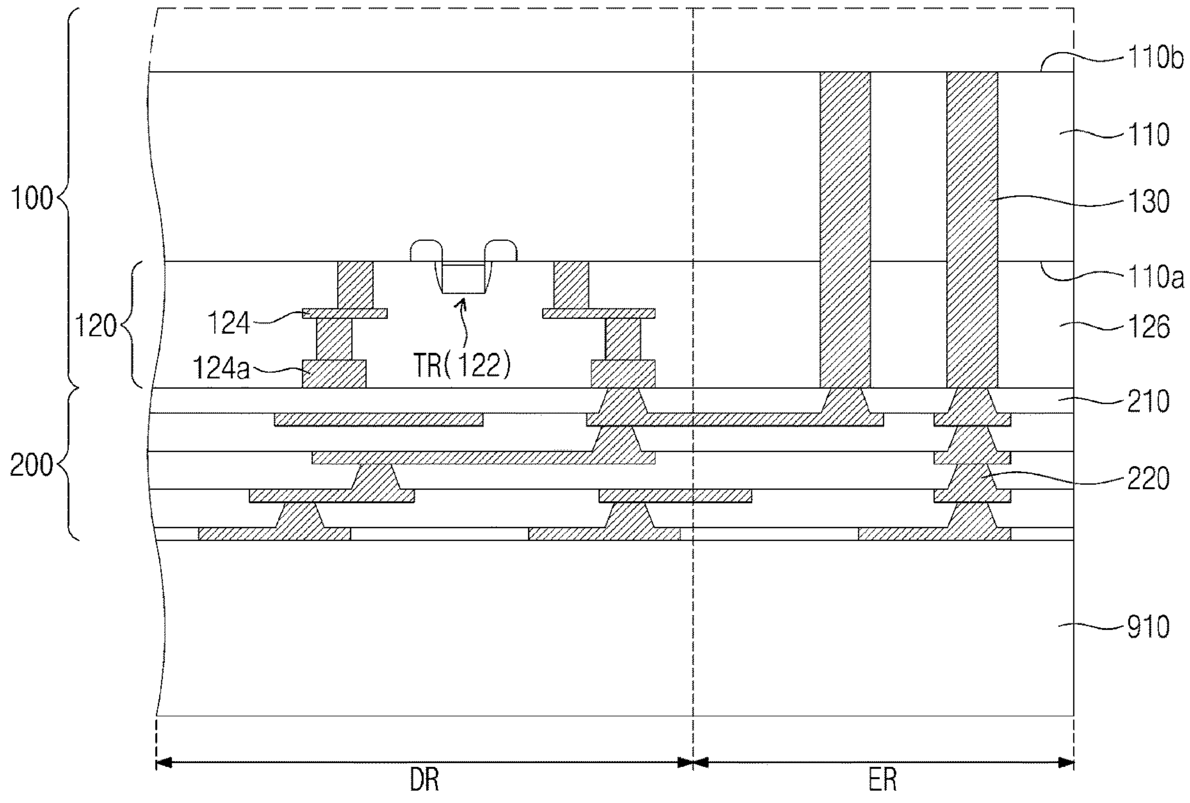

Referring to FIGS. 18A and 18B, the semiconductor substrate 110 may be provided on a carrier substrate 910. The carrier substrate 910 may be a dielectric substrate including glass or polymer, or may be a conductive substrate including metal. An adhesive member (e.g., glue tape) may be provided on an upper surface of the carrier substrate 910. The semiconductor substrate 110 may be attached to the carrier substrate 910 to allow the first redistribution layer 200 to face the carrier substrate 910.

A thinning process (e.g., a chemical mechanical polishing (CMP) process) may now be performed on the semiconductor substrate 110. The thinning process may be performed on the rear surface 110*b* of the semiconductor substrate 110 to remove a portion at the rear surface 110*b* of the semiconductor substrate 110. After the thinning process, upper surfaces of the through vias 130 may be exposed. However, in some embodiments, the thinning process may also remove upper portions of the through vias 130.

Figure 19A:
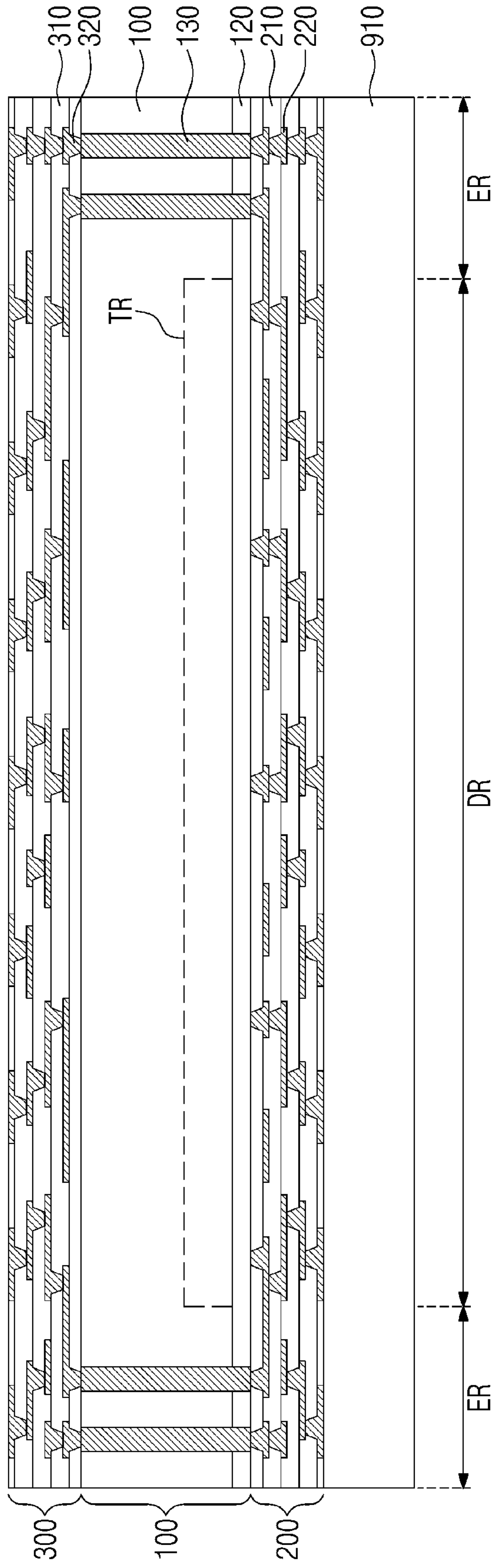
Figure 19B:
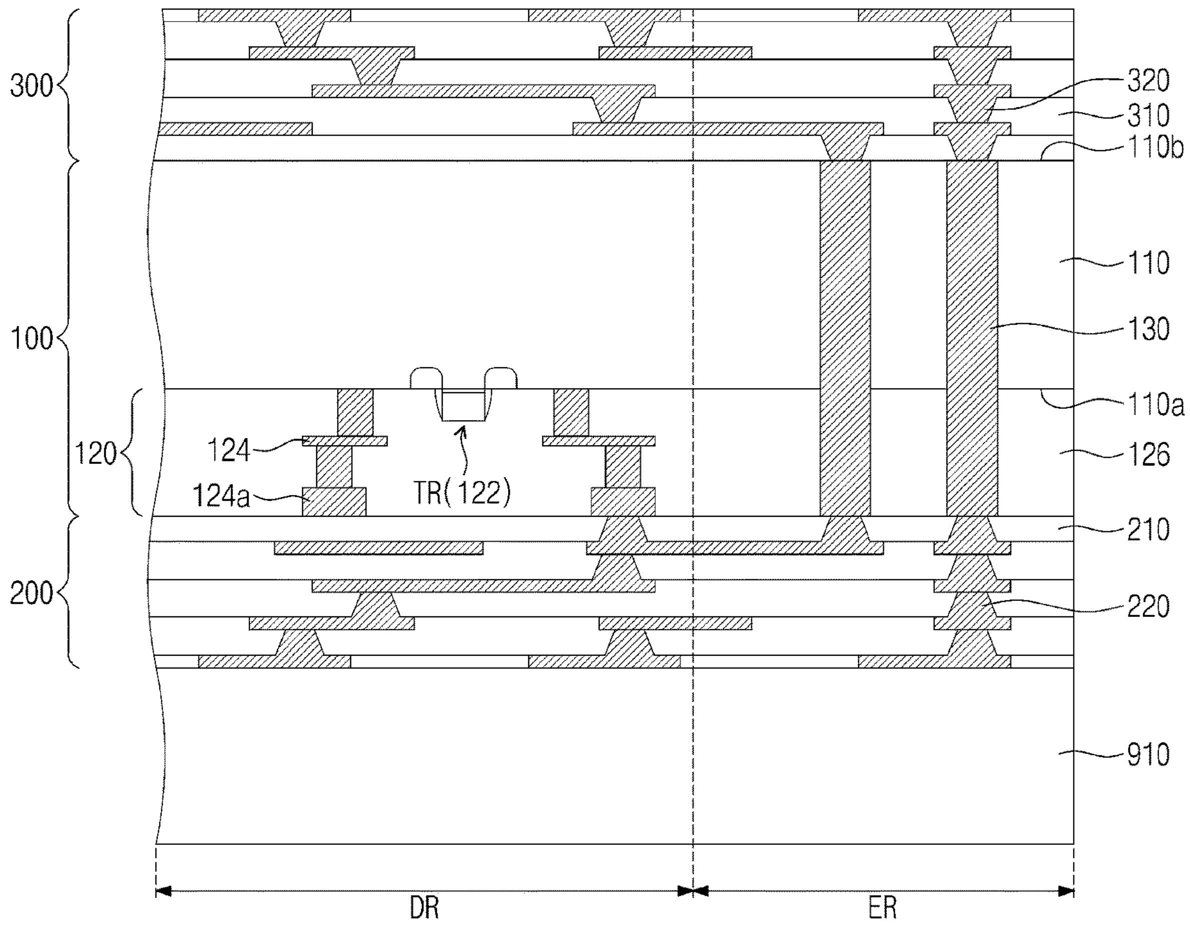

Referring to FIGS. 19A and 19B, the second redistribution layer 300 may be formed on the semiconductor substrate 110. For example, a dielectric layer may be formed on the rear surface 110*b* of the semiconductor substrate 110, the dielectric may be patterned to form a second redistribution dielectric layer 310, a conductive may be formed on the second redistribution dielectric layer 310, and the conductive layer may be patterned to form a second redistribution conductive pattern 320, with the result that one second wiring layer may be formed. The formation of the second wiring layer may be repeatedly performed to form the second redistribution layer 300.

In some embodiments, the formation of the second redistribution layer 300 may be omitted. (See e.g., the embodiment illustrated in FIG. 7).

Thereafter, the carrier substrate 910 may be removed from the first redistribution layer 200 to expose the lower surface of the first redistribution layer 200. In this regard, the adhesive member may be physically or chemically removed from the carrier substrate 910.

Figure 20A:
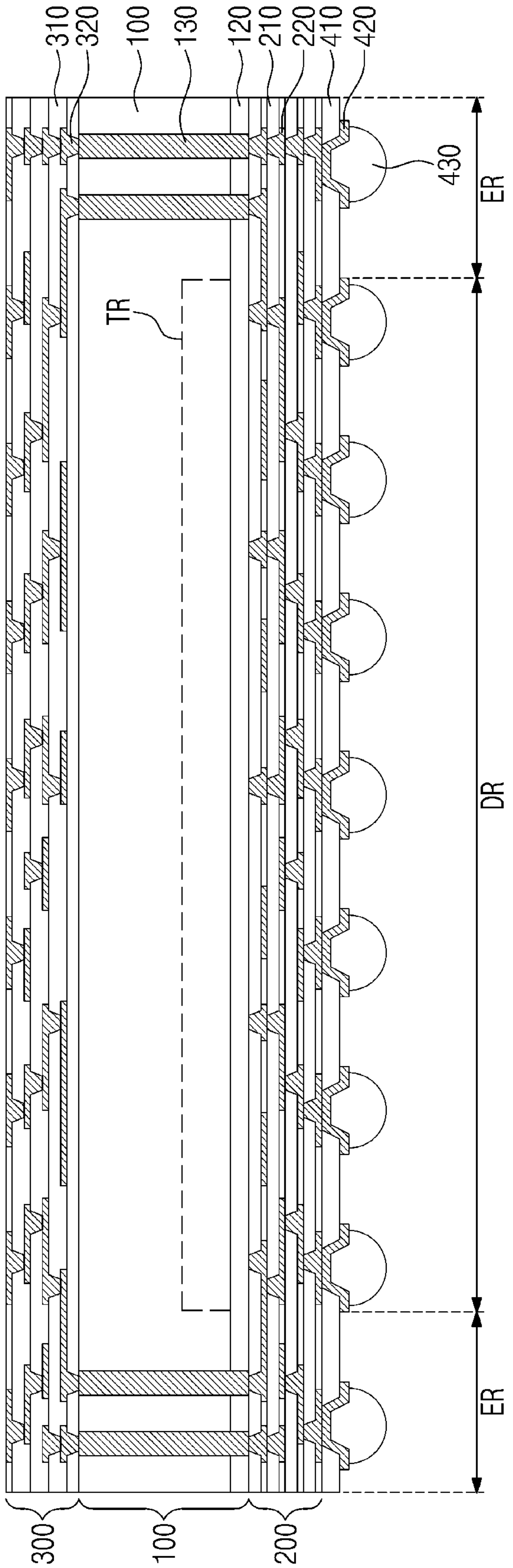
Figure 20B:
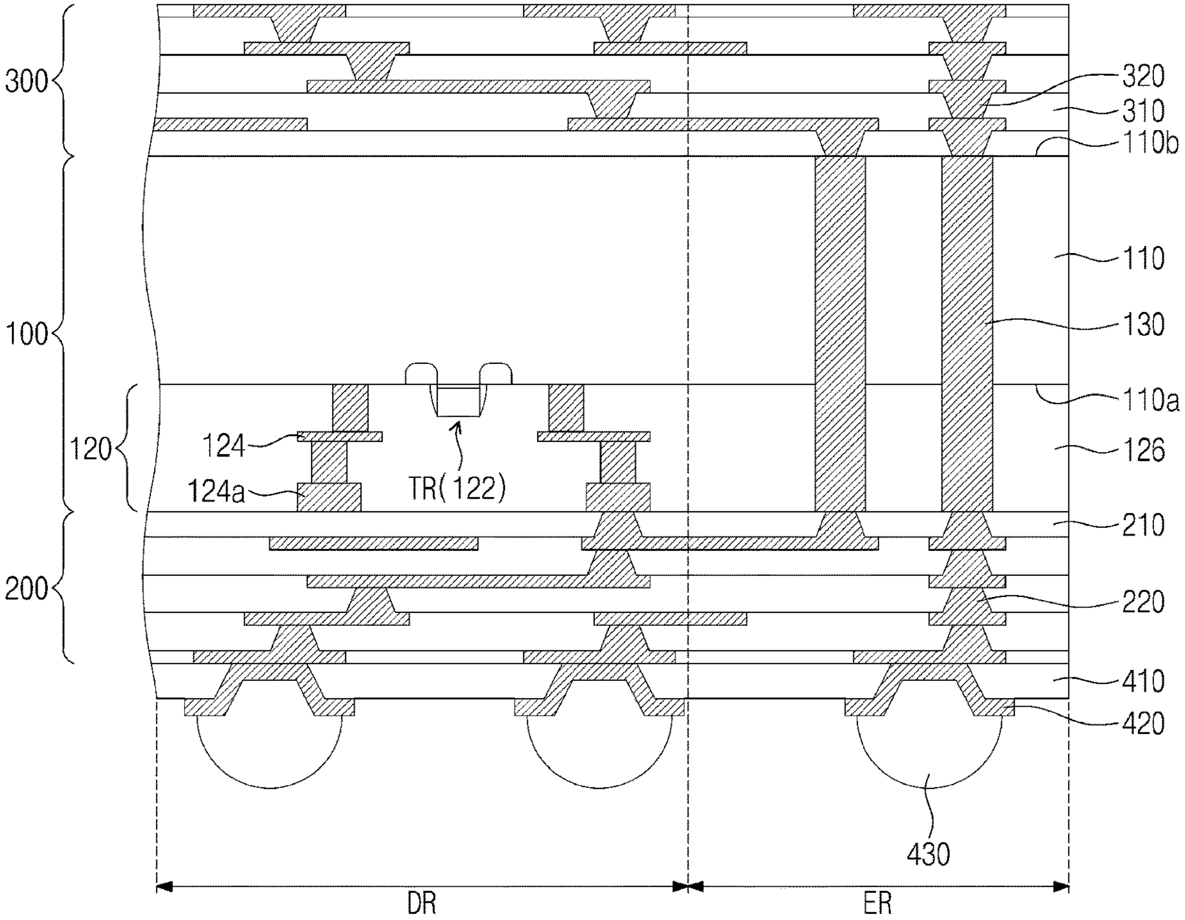

Referring to FIGS. 20A and 20B, the substrate protection layer 410 may be formed on the lower surface of the first redistribution layer 200. For example, the substrate protection layer 410 may be formed by coating or depositing a dielectric material on the lower surface of the first redistribution layer 200. The substrate protection layer 410 may include at least one of high density plasma (HDP) oxide, undoped silicate glass (USG), tetraethyl orthosilicate (TEOS), silicon nitride (SiN), silicon oxide (SiO), silicon carboxide (SiOC), silicon oxynitride (SiON), and silicon carbonitride (SiCN).

The substrate protection layer 410 may be patterned to expose the lower pads of the first redistribution layer 200 or the first redistribution conductive pattern 220 of the lowermost first wiring layer included in the first redistribution layer 200. A conductive layer may be formed on the substrate protection layer 410, and the conductive layer may be patterned to form external pads 420. The external pads 420 may be coupled to the lower pads of the first redistribution layer 200.

The external terminals 430 may be provided on the first redistribution layer 200. The external terminals 430 may be provided on lower surfaces of the external pads 420.

Certain semiconductor packages according to embodiments of the inventive concept include first and second redistribution layers respectively provided on upper and lower surfaces of a semiconductor chip. The first and second redistribution layers may be electrically connected using through vias that penetrate the body of the semiconductor chip in an edge region substantially surrounding a device region. Given this configuration, the resulting semiconductor packages may have a more compact size occupying a smaller area.

Since the first and second redistribution layers may be connected in the foregoing manner, no molding member is required for connection members conventionally used to connect upper and lower conductive elements. As a result, heat generated by operation of the semiconductor chip may be readily exhausted—given the absence of inherent insulating effects associated with the conventionally-provided molding member. And as a further result, semiconductor packages according to embodiments of the inventive concept exhibit improved thermal radiation properties.

Since the through vias are disposed in only designated edge region(s) of semiconductor packages according to embodiments of the inventive concept, such semiconductor packages enjoy relatively freedom of layout and/or freedom of interconnection. Accordingly, various circuit element(s) and associated circuit wiring pattern(s) may be designed to increase overall integration and/or prevent design failures (e.g., short-circuit electrical connections). As a result, more compact sized semiconductor packages exhibiting increased integration and improved electrical properties may be provided.

Although the inventive concept has been described in relation to certain embodiments thereof, those skilled in the art will appreciate that variations in form and detail may be made without departing from the scope of the inventive concept, as defined by the accompanying claims.

What is claimed is:

1. A semiconductor package, comprising:

a first semiconductor substrate that has a device region and an edge region;

a first semiconductor element on the device region, wherein the first semiconductor element is formed on an active surface of the first semiconductor substrate;

a first circuit layer disposed on the active surface of the first semiconductor substrate;

a first redistribution layer disposed on the first circuit layer; and a plurality of first through vias on the edge region, wherein the plurality of first through vias vertically penetrate the first semiconductor substrate and the first circuit layer and are connected to the first redistribution layer, wherein the first circuit layer includes:

a first device interlayer dielectric layer that covers the active surface of the first semiconductor substrate; and a first circuit wiring pattern on the device region, wherein the first circuit wiring pattern is provided in the first device interlayer dielectric layer and connected to the first semiconductor element, wherein the first circuit wiring pattern and the plurality of first through vias are electrically connected through the first redistribution layer, and wherein the plurality of first through vias are arranged in at least two columns that extend along an outer edge of the first semiconductor substrate and that are spaced apart from each other in a direction from the device region toward the outer edge of the first semiconductor substrate.

2. The semiconductor package of claim 1, wherein, when viewed in a plan view, the plurality of first through vias are spaced apart from the first circuit wiring pattern in a direction from the device region toward the edge region.

3. The semiconductor package of claim 1, wherein the first circuit wiring pattern is not provided on the edge region.

4. The semiconductor package of claim 1, wherein the plurality of first through vias vertically penetrate the first semiconductor substrate and the first device interlayer dielectric layer.

5. The semiconductor package of claim 1, wherein a ratio between a first area of the device region and a second area of the edge region is in a range of about 5:95 to about 95:5.

6. The semiconductor package of claim 1, further comprising a second redistribution layer disposed on an inactive surface of the first semiconductor substrate, wherein the plurality of first through vias connect the first redistribution layer and the second redistribution layer to each other.

7. The semiconductor package of claim 1, further comprising a plurality of pads disposed on the first redistribution layer, wherein at least one of the pads is positioned on the edge region.

8. A semiconductor package, comprising:

a first semiconductor chip that includes a first silicon substrate, a first semiconductor element formed on an active surface of the first silicon substrate, and a first circuit layer disposed on the active surface of the first silicon substrate;

a first redistribution layer disposed on an active surface of the first semiconductor chip and coupled to the first circuit layer;

a second redistribution layer disposed on an inactive surface of the first semiconductor chip;

a first through via that vertically penetrates the first semiconductor chip and connects the first redistribution layer and the second redistribution layer to each other; and a plurality of pads disposed on the first redistribution layer, wherein the first circuit layer includes:

a first device interlayer dielectric layer that covers the active surface of the first silicon substrate; and a first circuit wiring pattern provided in the first device interlayer dielectric layer, wherein the first through via is spaced apart from the first circuit wiring pattern.

9. The semiconductor package of claim 8, wherein the first silicon substrate includes a device region on which the first semiconductor element is provided and an edge region that surrounds the device region, the first circuit wiring pattern is provided on the device region, and the first through via is disposed on the edge region.

10. The semiconductor package of claim 9, wherein the first circuit wiring pattern is not provided on the edge region.

11. The semiconductor package of claim 9, wherein at least one of the pads is positioned on the edge region.

12. The semiconductor package of claim 8, wherein the first circuit wiring pattern and the first through via are electrically connected through the first redistribution layer.

13. The semiconductor package of claim 8, wherein the first through via is one of a plurality of first through vias that vertically penetrate the first silicon substrate and the first device interlayer dielectric layer.

14. The semiconductor package of claim 13, wherein each of a width of the first through via and an interval between the plurality of first through vias is in a range of about 0.001 mm to about 1 mm.

15. The semiconductor package of claim 8, further comprising:

a second semiconductor chip mounted on the second redistribution layer, wherein the second semiconductor chip includes a second silicon substrate, a second semiconductor element formed on an active surface of the second silicon substrate, and a second circuit layer disposed on the active surface of the second silicon substrate;

a third redistribution layer disposed on an active surface of the second semiconductor chip and coupled to the second circuit layer;

a fourth redistribution layer disposed on an inactive surface of the second semiconductor chip; and a second through via that vertically penetrates the second semiconductor chip and connects the third redistribution layer and the fourth redistribution layer to each other.

16. The semiconductor package of claim 15, wherein the second redistribution layer and the third redistribution layer are in contact with each other, and wherein a first conductive pattern of the second redistribution layer and a second conductive pattern of the third redistribution layer are directly coupled to each other.

17. The semiconductor package of claim 15, wherein the third redistribution layer is mounted on the second redistribution layer by using a plurality of chip terminals disposed between the second redistribution layer and the third redistribution layer.

18. The semiconductor package of claim 15, wherein;

the second silicon substrate is vertically aligned with the first silicon substrate, or the second silicon substrate is disposed shifted from the first silicon substrate in a direction parallel to a top surface of the first silicon substrate.

19. The semiconductor package of claim 8, further comprising:

a package substrate mounted on the first redistribution layer through a plurality of connection terminals provided on the pads; and a third semiconductor chip on the package substrate and horizontally spaced apart from the first semiconductor chip.

20. A semiconductor package, comprising:

a package substrate; and a chip package mounted on the package substrate, wherein the chip package includes:

a semiconductor chip that includes a silicon substrate and a circuit wiring pattern on the silicon substrate, the silicon substrate having a semiconductor element formed on an active surface of the silicon substrate, and the circuit wiring pattern being connected to the semiconductor element;

a first redistribution layer disposed on a first surface of the semiconductor chip, the first surface being directed toward the package substrate;

a second redistribution layer disposed on a second surface of the semiconductor chip, the second surface being opposite to the first surface; and a plurality of through vias that vertically penetrate the semiconductor chip and connect the first redistribution layer and the second redistribution layer to each other, wherein the plurality of through vias are positioned between the circuit wiring pattern and an outer edge of the silicon substrate, and wherein a distance from the outer edge of the silicon substrate to a conductive pattern of the first redistribution layer is less than a distance from the outer edge of the silicon substrate to the circuit wiring pattern.

* * * * *